United States Patent [19]
Ikai et al.

[11] Patent Number: 5,620,531
[45] Date of Patent: Apr. 15, 1997

[54] PHOTOVOLTAIC ELEMENT

[75] Inventors: Keizo Ikai; Iwane Shiozaki; Masaki Minami; Mitsuo Matsuno, all of Yokohama, Japan

[73] Assignee: Nippon Oil Co., Ltd., Tokyo, Japan

[21] Appl. No.: 572,415

[22] Filed: Dec. 14, 1995

[30] Foreign Application Priority Data

Dec. 14, 1994 [JP] Japan ................... 6-333091

[51] Int. Cl.$^6$ .................. H01L 31/06; H01L 31/07; H01L 31/0256
[52] U.S. Cl. .................. 136/263; 136/255; 136/261; 257/40; 257/431; 257/449; 257/458; 423/324; 423/348; 423/349; 438/82
[58] Field of Search .................. 136/255, 261, 136/263; 257/40, 76, 431, 449, 458, 461; 437/2–5; 423/324, 348–349

[56] References Cited

U.S. PATENT DOCUMENTS

| | | | |
|---|---|---|---|
| 3,009,981 | 11/1961 | Wildi et al. | 136/263 |
| 3,046,323 | 7/1962 | Wildi | 136/263 |
| 3,651,386 | 3/1972 | Youtsey et al. | 257/40 |
| 4,214,916 | 7/1980 | Felsher et al. | 136/255 |
| 4,639,329 | 1/1987 | Makashima et al. | 252/501.1 |

*Primary Examiner*—Aaron Weisstuch
*Attorney, Agent, or Firm*—Panitch Schwarze Jacobs & Nadel, P.C.

[57] ABSTRACT

A photovoltaic element produced from a product resulting from decomposition of a silicon polymer having an organic substituent of the group consisting of a hydrocarbon group, a halogenated hydrocarbon group, and a silyl group $R^3R^4R^5Si-$ (wherein $R^3-R^5$ each are identical or different, including $C_1-C_8$ alkyl groups and $C_6-C_{10}$ aryl groups). The inventive photovoltaic element is substantially pollution-free and capable of quantity production at a relatively large unit size.

5 Claims, 1 Drawing Sheet

PHOTOVOLTAIC ELEMENT

BACKGROUND OF THE INVENTION

1. Field of the Invention

This invention relates to a photovoltaic element useful inter alia for the production of solar cells.

2. Prior Art

During recent years there has been a growing demand for photovoltaic elements, specifically as solar cells, thanks to their remarkable environmental friendliness and contribution to energy saving, However, difficulties have been encountered in the production of solar cells made from monocrystalline silicon because this material is not only so costly but also the process of making such solar cells is so complicated as to prohibit practical commercial availability. Solar cells made from polycrystalline silicon are also known but this material is more difficult to prepare. Amorphous silicon solar cells are susceptible to initial deterioration and are costly to make due to the need for large-scale vacuum devices. Solar cells formed from gallium arsenide, cadmium sulfide, cadmium tellurium, and like semiconducting compounds pose a pollution problem.

SUMMARY OF THE INVENTION

With the foregoing difficulties and problems of the prior art in view, the present invention seeks to provide a photovoltaic element which can be produced in quantities at a relatively large unit size with utmost ease and which is substantially pollution-free.

It has now been found that such a photovoltaic element can be easily and conveniently produced from a product resulting from decomposition of a silicon polymer having an organic substituent.

Therefore, a photovoltaic element provided in accordance with the invention comprises a semiconducting material resulting from decomposition of a silicon polymer having an organic substituent.

DETAILED DESCRIPTION OF THE INVENTION

Figure 1:
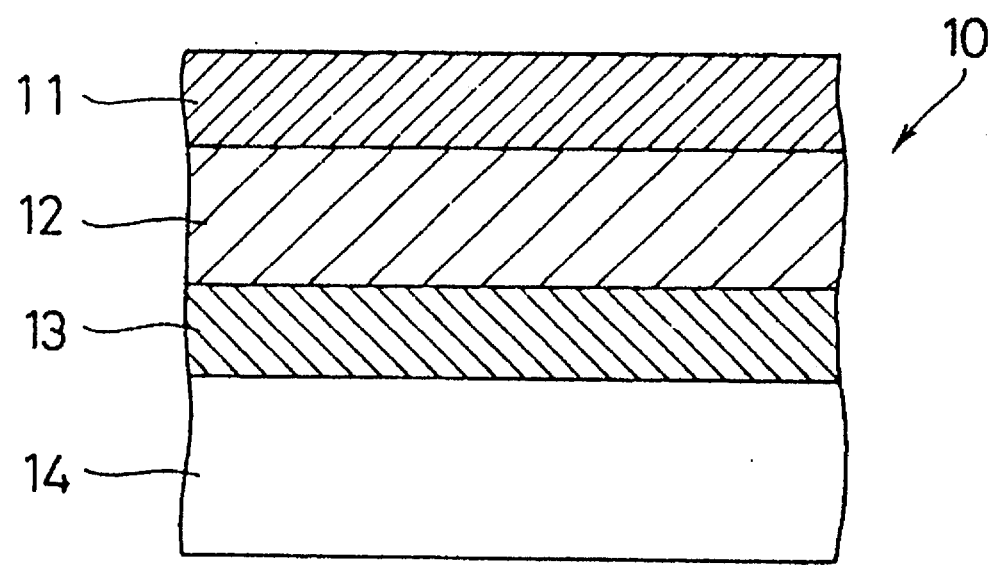
FIG. 1 is a cross-sectional view utilized to explain the construction of a photovoltaic element 10 embodying the invention which comprises a metallic film layer 11, a decomposed silicon polymer layer 12, a molybdenum layer 13, and a quartz base layer 14.

A starting silicon polymer used in the invention contains an organic substituent group which includes a hydrocarbon group, a halogenated hydrocarbon group, and a silyl group $R^3R^4R^5Si-$ (wherein $R^3$–$R^5$ are identical or different, including $C_1$–$C_8$ alkyl groups and $C_6$–$C_{10}$ aryl groups). The hydrocarbon group encompasses $C_1$–$C_{12}$, preferably $C_1$–$C_8$ alkyl, cycloalkyl, alkenyl and cycloalkenyl groups, $C_7$–$C_{12}$ aralkyl groups, $C_6$–$C_{12}$ aryl groups, as well as divalent or trivalent substituents derived therefrom. The halogenated hydrocarbon group is suitably a halogenated alkyl group. The silyl group includes trialkyl silyl, aryldialkyl silyl, triaryl, and diarylalkyl silyl groups.

The term silicon polymer as used herein designates such a silicon polymer which has at least one repeating unit of the formulae

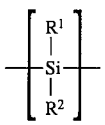

and

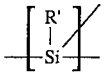

said one repeating unit essentially having an organic substituent. The inventive silicon polymer may further contain a repeating unit of the formula

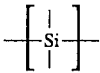

In the formulae (I) and (II) above, $R^1$, $R^2$, and $R'$ each are hydrogen, $C_1$–$C_{12}$ hydrocarbon group, halogenated hydrocarbon group, or silyl group $R^3R^4R^5Si-$ and may be crosslinked within and between each repeating unit.

The hydrocarbon group $R^1$, $R^2$, or $R'$ exemplarily includes $C_1$–$C_{12}$, preferably $C_1$–$C_8$ alkyl, cycloalkyl, alkenyl and cycloalkenyl groups, $C_7$–$C_{12}$ aralkyl groups and $C_6$–$C_{12}$ aryl groups. In case the repeating units are crosslinked therewithin or therebetween, and they include divalent or polyvalent groups derived from $R_1$, $R_2$, or $R'$. The alkyl groups include methyl, ethyl, n-propyl, isolpropyl, n-butyl, isobutyl, sec-butyl, t-butyl, n-pentyl, isopentyl, neopentyl, 1,2-dimethylpropylo, n-hexyl, 1,1,2-trimethylpropyl, 1-methylpentyl, 1-ethylbutyl, n-heptyl, 1-methylhexyl, 1,2,2-trimethylbutyl, 1,1-dimethylpentyl, n-octyl, 2-ethylhexyl, 1-methylheptyl, 1-ethylhexyl, 1,1-dimethylhexyl, n-nonyl, 1-methyloctyl, 1,1-dimethylheptyl, n-decyl, 1-ethylactyl, 1-methyl-1-ethylheptyl or the like. The cycloalkyl groups include cyclopropyl, cyclobutyl, cyclopentyl, cyclohexyl, cycloheptyl, 1-bicyclo-[2,2,1]heptyl, exo-2-bicyclo[2,2,1]heptyl, cyclooctyl, 1-bicyclo[2,2,2]octyl, 2-bycyclo[2,2,2]octyl, 1-adamantyl, 2-adamantyl or the like. The alkenyl groups include vinyl, 1-propenyl, allyl, isopropenyl, 1-butenyl, 2-butenyl, 2-methyl-2-propenyl, 1,3-butadienyl, 1-pentenyl, 2-pentenyl, 2-methyl-2-butenyl, 1,2-dimethyl-2-propenyl, 1-hexenyl, 2-hexenyl, 2,3-dimethyl-2-butenyl, 1-heptenyl, 2-heptenyl, 1-octenyl, 2-octenyl or the like. The cycloalkenyl groups include 1-cyclopentenyl, 2-cyclopentene-1-il, 1-cyclohexenyl, 2-cyclohexene-1-il, 3-cyclohexene-1-il, 1-cycloheptenyl, 2-cycloheptene-1-il, 3-cycloheptene-1-il, 2-bicyclo[2,2,1]heptene-1-il, 2-bicyclo[2,2,1]heptene-2-il, 5-bicyclo[2,2,1]heptene-2-il, 7- bicyclo[2,2,1]heptene-2-il, 1-cyclooctenyl, 2-cyclooctene-1-il, 3-cyclooctene-1-il, 2-bicyclo[2,2,2]octene-1-il, 2-bicyclo[2,2,2]octene-2-il, 2-bicyclo[2,2,2]octene-5-il, 2-bicyclo[2,2,2]octene-6-il or the like. The aralkyl groups include benzyl, 1-phenylethyl, 2-phenylethyl, cumyl or the like. The aryl groups include phenyl, o-tolyl, m-tolyl, p-tolyl, 2,3-xylyl, 2,4-xylyl, mesityl, o-cumenyl, m-cumenyl, p-cumenyl or the like. The silyl group exemplarily includes trimethylsilyl, triisopropylsilyl, t-butyldimethylsilyl, phenyldimethyl, triphenylsilyl or the like. The halogenated hydrocarbon group is a $C_1$–$C_{12}$ preferably $C_1$–$C_8$ halogenated alkyl group in which halogen is fluorine, chlorine, bromine, and iodine, with fluorine and chlorine being particularly preferred. The number of halogen substitution in the alkyl group is 1–12, preferably 1–6 in which 3,3,3-trifluoropropyl, 2-chloropropyl, 3-chloropropyl, 2,3-dichlorobutyl groups are included.

The unit of each of the formulae (I)–(III) may be of a block or random structure.

The ratios of the units (I)–(III) with organic substituents in the silicon polymer taken into account are: unit (II)≠0 if unit (I)=0; unit (I)≠0 if unit (II)=0; unit (II)/unit (I) if unit (I)≠0 is 0–1,000, preferably less than 1,000 above 0, more preferably 0.01–100; unit (III)/unit (I) if unit (I)≠0 is 0–1,000, preferably less than 1,000 above 0, more preferably 0.01–100; unit (III)/unit (II) if unit (I)≠0 and unit (II)≠0 is 0–1,000, preferably less than 1,000 above 0, more preferably 0.1–100; and the ratio of each of unit (I)/unit (II) and unit (III)/unit (II) if unit (II)≠0 is 0–1,000, preferably less than 1,000 above 0, more preferably 0.1–100.

The silicon polymer is normally liquid or solid, and its polymerization degree is greater than 2, preferably in the range of 6–2,000, and its molecular weight is usually in the range of 100–ten million, preferably 100–one million by weight average (Mw), and usually in the range of 100–one million, preferably 300–500,000 by number average (Wn).

The silicon polymer used in the invention may be prepared by any known suitable methods; for example, by the Kipping method in which monomers of halogenosilanes are subjected to Wurtz condensation reaction in an inert solvent and with use of an alkali metal; by the dehydrogenative condensation in which monomers of hydrosilanes are subjected to condensation in the presence of a transition metal catalyst; and by electrolytic polymerization in which monomers of halogenosilanes or hydrosilanes are subjected to condensation by electrolytic reduction.

A preferred process for the production of the silicon polymer used in the invention is the dehydrogenative condensation of one or more hydrosilanes of the formulae

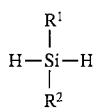  (IV)

wherein $R^1$ and $R^2$ are identical or different, including hydrogen, $C_1$–$C_{12}$ alkyl, cycloalkyl and halogenated alkyl groups, $C_7$–$C_{12}$ aralkyl and halogenated aralkyl groups, $C_6$–$C_{12}$ aryl groups and silyl groups of the formula (VII) hereinafter shown;

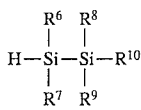  (V)

wherein $R^6$ and $R^{10}$ each are identical or different, including hydrogen, $C_1$–$C_{12}$ alkyl, cycloalkyl and halogenated alkyl groups, $C_7$–$C_{12}$ aralkyl and halogenated aralkyl groups and $C_6$–$C_{12}$ aryl groups, and either one of $R^6$–$R^{10}$ is invariably hydrogen; and

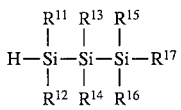  (VI)

wherein $R^{11}$ and $R^{17}$ each are identical or different, including hydrogen, $C_1$–$C_{12}$ alkyl, cycloalkyl and halogenated alkyl groups, $C_7$–$C_{12}$ aralkyl and halogenated aralkyl groups, $C_6$–$C_{12}$ aryl groups and silyl groups of the formula (VIII) hereinafter shown.

The above condensation reaction is carried out in the presence of a catalyst chosen from the group consisting of:

(a) at least one metal or metallic compound of Groups 3B–7B and 8 in the Periodic Table, (b) a mixture of the above metal or metallic compound (a) and a silyl compound of the formula (VIII) and (c) a mixture of a above and a metal hydride of the formula (IX) given below.

The resulting condensates are subjected to thermal decomposition.

The silyl group referred to in formula (IV) above is represented by the formula

  (VII)

wherein $R^3$–$R^5$ each are identical or different, including $C_1$–$C_8$ alkyl groups and $C_6$–$C_{10}$ aryl groups.

The silyl group referred to in formula (VI) above is represented by the formula

  (VIII)

wherein $R^{18}$–$R^{20}$ each are identical or different, including $C_1$–$C_{12}$ alkyl groups, $C_7$–$C_{12}$ aralkyl groups, $C_6$–$C_{12}$ aryl groups and silyl groups of formula (VII), and A is lithium, sodium, or potassium.

The metal hydride referred to above as a catalyst component is represented by the formula

  (IX)

wherein A' is lithium, sodium, potassium, calcium, aluminum, $R^{21}_{(4-n)}$, boron, $R^{21}_{(3-n)}$B, LiB, LiBR$^{22}$, NaB, KB or $R^{23}$B where $R^{21}$ is a $C_1$–$C_5$ alkyl group, $R^{22}$ is a $C_1$–$C_8$ alkyl or alkoxy group and $R^{23}$ is hydrogen or a tertiary ammonium having a $C_1$–$C_4$ alkyl group; X is hydrogen or heavy hydrogen; and n is an integer of 1–4, and where n is 1–3, $R^{21}$, $R^{22}$ and $R^{23}$ each may be different.

Turning back to the hydromonosilane of formula (IV), $R^1$ and $R^2$ each more specifically are hydrogen, a $C_1$–$C_{12}$, preferably $C_1$–$C_8$ alkyl group, a $C_3$–$C_{12}$, preferably $C_5$–$C_6$ cycloalkyl group, and a $C_1$–$C_{12}$, preferably $C_1$–$C_8$ halogenated alkyl group in which halogen is fluorine, chlorine, bromine, or iodine, fluorine being particularly preferred. The number of halogen substitution in the alkyl group is 1–12, preferably 1–6 of which 3,3,3-trifluoropropyl group is particularly preferred. Specific examples of the hydromonosilane include silane, methylsilane, ethylsilane, n-propylsilane, (3,3,3-trifluoropropyl)silane, n-butylsilane, t-butylsilane, (1-methylpropyl)silane, (2-methylpropyl)silane, n-hexylsilane, cyclohexylsilane, n-heptylsilane, n-octylsilane, n-nonylsilane, n-decylsilane, n-dodecylsilane, phenylsilane, p-tolylsilane, methylsilane, benzylsilane, phenethylsilane, (trimethylsilylmethyl)silane, dimethylsilane, diethylsilane, di-n-propylsilane, di-n-butylsilane, di-n-hexylsilane, di-n-octylsilane, diphenylsilane, dibenzylsilane, diphenethylsilane, methylphenylsilane, p-tolylmethylsilane, benzylmethylsilane, methylphenethylsilane or the like. Further examples include hydromonosilane monomers such as bis(3,3,3-trifluoropropyl)silane, di-n-butylsilane, di-t-butylsilane, di(1-methylpropyl)silane, di(2-methylpropyl)silane, dipentylsilane, dicyclohexylsilane, di-n-heptylsilane, di-n-nonylsilane, di-n-decylsilane, di-n-dodecylsilane, di-p-tolylsilane, dimethylsilane, bis(trimethylsilylmethyl)silane, ethylmethylsilane, methyl-n-propylsilane, methyl(3,3,3-trifluoropropyl)silane, methyl-i-propylsilane, n-butylmethylsilane, t-butylmethylsilane, methyl(1-methylpropyl)silane, methyl(2-methylpropyl)silane, amylmethylsilane, n-hexylmethylsilane, cyclohexylmethylsilane, n-heptylmethylsilane, methyl-n-octylsilane, methyl-n-nonylsilane, n-decylmethylsilane, n-dodecylmethylsilane, methylmesitylsilane, (p-methylphenetyl)silane, ethylphenylsilane and t-butylphenylsilane.

The hydrodisilane identified by formula (V) is preferably chosen from the group consisting of disilane, methyldisilane, ethyldisilane, n-propyldisilane, (3,3,3-trifluoropropyl)disilane, n-butyldisilane, t-butyldisilane, (1-methylpropyl)disilane, (2-methylpropyl)disilane, pentyldisilane, n-hexyldisilane, cyclohexyldisilane, n-heptyldisilane, n-octyldisilane, n-nonyldisilane, n-decyldisilane, n-dodecyldisilane, phenyldisilane, p-tolyldisilane, mesityldisilane, methyl(trimethylsilylmethyl)disilane, benzyldisilane, phenethyldisilane, 1,1-dimethyldisilane, 1,1-diethyldisilane, 1,1-di-n-propyldisilane, 1,1-di-n-butyldisilane, 1,1-di-n-amyldisilane, 1,1-di-n-hexyldisilane, 1,1-dicyclohexyldisilane, 1,1-diphenyldisilane, 1,1-dimesityldisilane, 1,2-dimethyldisilane, 1,2-dimethyldisilane, 1,2-di-n-propyldisilane, 1,2-di-n-butyldisilane, 1,2-di-n-amyldisilane, 1,2-di-n-hexyldisilane, 1,2-dicyclohexyldisilane, 1,2-diphenyldisilane, 1,2-dimesityldisilane or the like, and further includes 1-ethyl-1-methyldisilane, 1-methyl-1-n-propyldisilane, 1-methyl-1-i-propyldisilane, 1-n-butyl-1-methyldisilane, 1-t-butyl-1-methyldisilane, 1-n-hexyl-1-methyldisilane, 1-cyclohexyl-1-methyldisilane, 1-n-heptyl-1-methyldisilane, 1-methyl-1-n-octyldisilane, 1-n-decyl-1-methyldisilane, 1-methyl-1-phenyldisilane, 1-(p-methylphenethyl)-1-methyldisilane, 1-methyl-1-(β-phenethyl)disilane, 1-p-tolyl-1-methyldisilane, 1-phenyl-1-ethyldisilane, 1-t-butyl-1-phenyldisilane, 1-ethyl-2-methyldisilane, 1-methyl-2-n-propyldisilane, 1-methyl-2-propyldisilane, 1-n-butyl-2-methyldisilane, 1-t-butyl-2-methyldisilane, 1-n-hexyl-2-methyldisilane, 1-cyclohexyl-2-methyldisilane, 1-n-heptyl-2-methyldisilane, 1-methyl-2-n-octyldisilane, 1-n-decyl-2-methyldisilane, 1-methyl-2-phenyldisilane, 1-(p-methylphenethyl)-2-methyldisilane, 1-methyl-2-(β-phenethyl)disilane, 1-p-tolyl-2-methyldisilane, 1-phenyl-2-ethyldisilane, 1-t-butyl-2-phenyldisilane, trimethylsilylsilane, triphenylsilylsilane, (t-butyldimethylsilyl)silane, 1,1,2-trimethyldisilane, 1,1,2-triethyldisilane, 1,1,2-tri-n-propyldisilane, 1,1,2-tri-n-butyldisilane, 1,1,2-tri-n-amyldisilane, 1,1,2-tri-n-hexyldisilane, 1,1,2-tricyclohexyldisilane, 1,1,2-triphenyldisilane, 1,1,2-trimethyldisilane, 1,1-diethyl-2-methyldisilane, 1,1-dimethyl-2-n-propyldisilane, 1,1-dimethyl-2-i-propyldisilane, 1,1-di-n-butyl-2-methyldisilane, 1,1-di-t-butyl-2-methyldisilane, 1,1-di-n-hexyl-2-methyldisilane, 1,1-dicyclohexyl-2-methyldisilane, 1,1-di-n-heptyl-2-methyldisilane, 1,1-dimethyl-2-n-octyldisilane, 1,1-di-n-decyl-2-methyldisilane, 1,1-dimethyl-2-phenyldisilane, 1,1-di-(p-methylphenethyl)-2-methyldisilane, 1,1-dimethyl-2-(β-phenethyl)disilane, 1,1-di-p-tolyl-2-methyldisilane, 1,1-diphenyl-2-ethyldisilane, 1,1-di-t-butyl-2-phenyldisilane, 1-ethyl-2,2-dimethyldisilane, 1-methyl-2,2-di-n-propyldisilane, 1-methyl-2,2-di-i-propyldisilane, 1-n-butyl-2,2-dimethyldisilane, 1-t-butyl-2,2-dimethyldisilane, 1-n-hexyl-2,2-dimethyldisilane, 1-cyclohexyl-2,2-dimethyldisilane, 1-n-heptyl-2,2-dimethyldisilane, 1-methyl-2,2-di-n-octyldisilane, 1-n-decyl-2,2-dimethyldisilane, 1-methyl-2,2-diphenyldisilane, 1-(p-methylphenethyl)-2,2-dimethyldisilane, 1-methyl-2,2-di(β-phenethyl)disilane, 1-p-tolyl-2,2-dimethyldisilane, 1-phenyl-2,2-diethyldisilane, 1-t-butyl-2,2-diphenyldisilane, 1,1,1,2-tetramethyldisilane, 1,1,1,2-tetraethyldisilane, 1,1,1,2-tetra-n-propyldisilane, 1,1,1,2-tetra-n-butyldisilane, 1,1,1,2-tetra-n-amyldisilane, 1,1,1,2-tetra-n-hexyldisilane, 1,1,1,2-tetracyclohexyldisilane, 1,1,1,2-tetraphenyldisilane 1,1,1,2-tetramethyldisilane, 1,1,2,2-tetramethyldisilane, 1,1,2,2-tetra-npropyldisilane, 1,1,2,2-tetra-n-butyldisilane, 1,1,2,2-tetra-namyldisilane, 1,1,2,2-tetra-n-hexyldisilane, 1,1,2,2-tetracyclohexyldisilane, 1,1,2,2-tetraphenyldisilane, 1,1,2,2-tetramesityldisilane, 1,1,1-triethyl-2-methyldisilane, 1,1,1-trimethyl-2-n-propyldisilane, 1,1,1-trimethyl-2-i-propyldisilane, 1,1,1-tri-n-butyl-2-methyldisilane, 1,1,1-tri-t-butyl-2-methyldisilane, 1,1,1-tri-n-hexyl-2-methyldisilane, 1,1,1-tricyclohexyl-2-methyldisilane, 1,1,1-n-heptyl-2-methyldisilane, 1,1,1-trimethyl-2-n-octyldisilane, 1,1,1-tri-n-decyl-2-methyldisilane, 1,1,1-trimethyl-2-phenyldisilane, 1,1,1-tri-(p-methylphenethyl)-2-methyldisilane, 1,1,1-trimethyl-2-(β-phenethyl)disilane, 1,1,1-tri-p-tolyl-2-methyldisilane, 1,1,1-triphenyl-2-ethyldisilane, 1,1,1-tri-t-butyl-phenyldisilane, 1-ethyl-2,2,2-trimethyldisilane, 1-methyl-2,2,2-tri-n-propyldisilane, 1-methyl-2,2,2-tri-i-propyldisilane, 1-n-butyl-2,2,2-trimethyldisilane, 1-t-butyl-2,2,2-trimethyldisilane, 1-n-hexyl-2,2,2-trimethyldisilane, 1-cyclohexyl-2,2,2-trimethyldisilane, 1-n-heptyl-2,2,2-trimethyldisilane, 1-methyl-2,2,2-tri-n-octyldisilane, 1-n-decyl-2,2,2-trimethyldisilane, 1-methyl-2,2,2-triphenyldisilane, 1-(p-methylphenethyl)-2,2,2-trimethyldisilane, 1-methyl-2,2,2-tri(β-phenethyl)disilane, 1-p-tolyl-2,2,2-trimethyldisilane, 1-phenyl-2,2,2-triethyldisilane, 1-t-butyl-2,2,2-triphenyldisilane, 1,1-diethyl-2,2-dimethyldisilane, 1,1-dimethyl-2,2-di-n-propyldisilane, 1,1-dimethyl-2,2-di-i-propyldisilane, 1,1-di-n-butyl-2,2-dimethyldisilane, 1,1-di-t-butyl-2,2-dimethyldisilane, 1,1-di-n-hexyl-2,2-dimethyldisilane, 1,1-dicyclohexyl-2,2-dimethyldisilane, 1,1-di-n-heptyl-2,2-dimethyldisilane, 1,1-dimethyl-2,2-di-n-octyldisilane, 1,1-din-decyl-2,2-dimethyldisilane, 1,1-dimethyl-2,2-diphenyldisilane, 1,1-di-(p-methylphenethyl)-2,2-dimethyldisilane, 1,1-dimethyl-2,2-di(β-phenethyl)disilane, 1,1-di-p-tolyl-2,2-dimethyldisilane, 1,1-didiphenyl-2,2-diethyldisilane, 1,1-di-t-butyl-2,2-diphenyldisilane, 1,2-diethyl-1,2-dimethyldisilane, 1,2-dimethyl-1,2-di-n-propyldisilane, 1,2-dimethyl-1,2-di-i-propyldisilane, 1,2-di-n-butyl-1,2-dimethyldisilane, 1,2-di-t-butyl-1,2-dimethyldisilane, 1,2-di-n-hexyl-1,2-dimethyldisilane, 1,2-dicyclohexyl-1,2-dimethyldisilane, 1,2-di-n-heptyl-1,2-dimethyldisilane, 1,2-dimethyl-1,2-di-n-octyldisilane, 1,2-din-decyl-1,2-dimethyldisilane, 1,2-dimethyl-1,2-diphenyldisilane, 1,2-di-(p-methylphenethyl)-1,2-dimethyldisilane, 1,2-dimethyl-1,2-di(β-phenethyl)disilane, 1,2-di-p-tolyl-1,2-dimethyldisilane, 1,2-didiphenyl-1,2-diethyldisilane, 1,2-di-t-butyl-1,2-diphenyldisilane or the like.

The hydrotrisilane used in the invention is identified by formula (VI) above wherein $R^{11}$ and $R^{17}$ each are a $C_1$–$C_{12}$, preferably $C_1$–$C_8$ alkyl group, a $C_3$–$C_{12}$, preferably $C_5$–$C_6$ cycloalkyl group such as cyclopentyl and cyclohexyl, a $C_1$–$C_{12}$, preferably $C_1$–$C_8$ hydrogenated alkyl group containing, as halogen, fluorine, chlorine, bromine, and iodine, of which fluorine is particularly preferred. The number of halogen substitution in the alkyl group is 1–12, preferably 1–6, preferably such as 3,3,3-trifluoropropyl group.

The hydrotrisilane used in the invention is identified by formula (VI) above wherein $R^{11}$ and $R^{17}$ each are a $C_1$–$C_{12}$, preferably $C_1$–$C_8$ alkyl group, a $C_3$–$C_{12}$, preferably $C_5$–$C_6$ cycloalkyl group such as cyclopentyl and cyclohexyl, a $C_1$–$C_{12}$, preferably $C_1$–$C_8$ hydrogenated alkyl group containing, as halogen, fluorine, chlorine, bromine, and iodine, of which fluorine is particularly preferred. The number of halogen substitution in the alkyl group is 1–12, preferably 1–6, preferably such as 3,3,3-trifluoropropyl group.

The formula (VI) monomers preferably include trisilane, 1-methyltrisilane, 1-ethyltrisilane, 1-1-n-propyltrisilane, 1-(3,3,3-trifluoropropyl)trisilane, 1-n-butyltrisilane, 1-t-butyltrisilane, 1-(1-methylpropyl)trisilane, 1-(2-methylpropyl)trisilane, 1-amyltrisilane, 1-n-hexyltrisilane, 1-cyclohexyltrisilane, 1-n-heptyltrisilane, 1-n-octyltrisilane, 1-n-nonyltrisilane, 1-n-decyltrisilane, 1-n-dodecyltrisilane, 1-phenyltrisilane, 1-p-tolyltrisilane, 1-mesityltrisilane, 1-benzyltrisilane, 1-phenethyltrisilane, 1-(trimethylsilylmethyl)trisilane, 2-methyltrisilane, 2-ethyltrisilane, 2-n-propyltrisilane, 2-(3,3,3-trifluoropropyl)trisilane, 2-n-butyltrisilane, 2-t-butyltrisilane, 2-(1-methylpropyl)trisilane, 2-(2-methylpropyl)trisilane, 2-amyltrisilane, 2-n-hexyltrisilane, 2-cyclohexyltrisilane, 2-n-heptyltrisilane, 2-n-octyltrisilane, 2-n-nonyltrisilane, 2-n-decyltrisilane, 2-n-dodecyltrisilane, 2-phenyltrisilane, 2-p-tolyltrisilane, 2-mesityltrisilane, 2-benzyltrisilane, 2-phenethyltrisilane, 2-(trimethylsilylmethyl)trisilane, 1,1-dimethyltrisilane, 1,1-diethyltrisilane, 1,1-di-n-propyltrisilane, bis(3,3,3-trifluoropropyl)trisilane, 1,1-di-n-butyltrisilane, 1,1-di-t-butyltrisilane, di(1-methylpropyl)trisilane, di(2-methylpropyl)trisilane, 1,1-diamyltrisilane, 1,1-di-n-hexyltrisilane, 1,1-dicyclohexyltrisilane, 1,1-di-n-heptyltrisilane, 1,1-di-n-octyltrisilane, 1,1-di-n-nonyltrisilane, 1,1-di-n-decyltrisilane, 1,1-di-n-dodecyltrisilane, 1,1-diphenyltrisilane, 1,1-di-p-tolyltrisilane, 1,1-dimesityltrisilane, 1,1-dibenzyltrisilane, 1,1-diphenethyltrisilane, 1,1-bis(trimethylsilylmethyl)trisilane, 1,2-dimethyltrisilane, 1,2-diethyltrisilane, 1,2-di-n-propyltrisilane, bis(3,3,3-trifluoropropyl)trisilane, 1,2-di-n-butyltrisilane, 1,2-di-t-butyltrisilane, di(1-methylpropyl)trisilane, di(2-methylpropyl)trisilane, 1,2-diamyltrisilane, 1,2-di-n-hexyltrisilane, 1,2-dicyclohexyltrisilane, 1,2-di-n-heptyltrisilane, 1,2-di-n-octyltrisilane, 1,2-di-n-nonyltrisilane, 1,2-di-n-decyltrisilane, 1,2-di-n-dodecyltrisilane, 1,2-diphenyltrisilane, 1,2-di-p-tolyltrisilane, 1,2-dimesityltrisilane, 1,2-dibenzyltrisilane, 1,2-diphenethyltrisilane, 1,2-bis(trimethylsilylmethyl)trisilane, 1,3-dimethyltrisilane, 1,3-diethyltrisilane, 1,3-di-n-propyltrisilane, bis(3,3,3-trifluoropropyl)trisilane, 1,3-di-n-butyltrisilane, 1,1-di-t-butyltrisilane, di(1-methylpropyl)trisilane, di(2-methylpropyl)trisilane, 1,3-diamyltrisilane, 1,3-di-n-hexyltrisilane, 1,3-dicyclohexyltrisilane, 1,3-di-n-heptyltrisilane, 1,3-di-n-octyltrisilane, 1,3-di-n-nonyltrisilane, 1,3-di-n-decyltrisilane, 1,3-di-n-dodecyltrisilane, 1,3-diphenyltrisilane, 1,3-di-p-tolyltrisilane, 1,3-dimesityltrisilane, 1,3-dibenzyltrisilane, 1,3-diphenethyltrisilane, 1,3-bis(trimethylsilylmethyl)trisilane, 1,1,1-trimethyltrisilane, 1,1,1-triethyltrisilane, 1,1,1-tri-n-propyltrisilane, 1,1,1-tris(3,3,3-trifluoropropyl)trisilane, 1,1,1-tri-n-butyltrisilane, 1,1,1-tri(1-methylpropyl)trisilane, 1,1,1-tri(2-metylpropyl)trisilane, 1,1,1-tri-n-amyltrisilane, 1,1,1-tri-n-hexyltrisilane, 1,1,1-tricyclohexyltrisilane, 1,1,1-tri-n-heptyltrisilane, 1,1,1-tri-n-octyltrisilane, 1,1,1-tri-n-nonyltrisilane, 1,1,1-tri-n-decyltrisilane, 1,1,1-tri-n-dodecyltrisilane, 1,1,1-triphenyltrisilane, 1,1,1-tri-p-tolyltrisilane, 1,1,1-trimesityltrisilane, 1,1,1-tribenzyltrisilane, 1,1,1-triphenethyltrisilane, 1,1,1-tris(trimethylsilylmethyl)trisilane, 1-ethyl-1,1-dimethyltrisilane, 1-methyl-1,1-di-n-propyltrisilane, 1-methyl-1,1-bis(3,3,3-trifluoropropyl)trisilane, 1-methyl-1,1-di-i-propyltrisilane, 1-n-butyl-1,1-dimethyltrisilane, 1-t-butyl-1,1-dimethyltrisilane, 1-methyl-1,1-di(1-methylpropyl)trisilane, 1-methyl-1,1-di(2-methylpropyl)trisilane, 1-amyl-1,1-dimethyltrisilane, 1-n-hexyl-1,1-dimethyltrisilane, 1-cyclohexyl-1,1-dimethyltrisilane, 1-n-heptyl-1,1-dimethyltrisilane, 1-methyl-1,1-di-n-octyltrisilane, 1-methyl-1,1-di-n-nonyltrisilane, 1-n-decyl-1,1-dimethyltrisilane, 1-n-dodecyl-1,1-dimethyltrisilane, 1-methyl-1,1-diphenyltrisilane, 1-p-tolyl-1,1-dimethyltrisilane, 1-methyl-1,1-dimesityltrisilane, 1-benzyl-1,1-dimethyltrisilane, 1-methyl-1,1-diphenethyltrisilane, 1-methyl-1,1-bis(trimethylsilylmethyl)trisilane, 1-(p-methylphenethyl)-1,1-dimethyltrisilane, 1-ethyl-1,1-diphenyltrisilane, 1-t-butyl-1,1-diphenyltrisilane or the like, and further exemplarily include 1-ethyl-1-methyltrisilane, 1-methyl-1-n-propyltrisilane, 1-methyl-1-(3,3,3-trifluoropropyl)trisilane, 1-methyl-1-i-propyltrisilane, 1-n-butyl-1-methyltrisilane, 1-t-butyl-1-methyltrisilane, 1-methyl-1-(1-methylpropyl)trisilane, 1-methyl-1-(2-methylpropyl)trisilane, 1-amyl-1-methyltrisilane, 1-n-hexyl-1-methyltrisilane, 1-cyclohexyl-1-methyltrisilane, 1-n-heptyl-1-methyltrisilane, 1-methyl-1-n-octyltrisilane, 1-methyl-1-n-nonyltrisilane, 1-n-decyl-1-methyltrisilane, 1-n-dodecyl-1-methyltrisilane, 1-methyl-1-phenyltrisilane, 1-p-tolyl-1-methyltrisilane, 1-mesityl-1-methyltrisilane, 1-benzyl-1-methyltrisilane, 1-methyl-1-phenethyltrisilane, 1-methyl-1-(trimethylsilylmethyl)trisilane, 1-(p-methylphenethyl)-1-methyltrisilane, 1-ethyl-1-phenyltrisilane, 1-t-butyl-1-phenyltrisilane, 1-ethyl-2-methyltrisilane, 1-methyl-2-n-propyltrisilane, 1-methyl-2-(3,3,3-trifluoropropyl)trisilane, 1-methyl-2-i-propyltrisilane, 1-n-butyl-2-methyltrisilane, 1-t-butyl-2-methyltrisilane, 1-methyl-2-(1-methylpropyl)trisilane, 1-methyl-2-(2-methylpropyl) trisilane, 1-amyl-2-methyltrisilane, 1-n-hexyl-2-methyltrisilane, 1-cyclohexyl-2-melthyltrisilane, 1-n-heptyl-2-methyltrisilane, 1-methyl-2-n-octyltrisilane, 1-methyl-2-n-nonyltrisilane, 1-n-decyl-2-methyltrisilane, 1-n-dodecyl-2-methyltrisilane, 1-methyl-2-phenyltrisilane, 1-p-tolyl-2-methyltrisilane, 1-methyl-2-mesityltrisilane, 1-benzyl-2-methyltrisilane, 1-methyl-2-phenethyltrisilane, 1-methyl-2-(trimethylsilylmethyl)trisilane, 1-(p-methylphenethyl)-2-methyltrisilane, 1-ethyl-2-phenyltrisilane, 1-t-butyl-2-phenyltrisilane, 1-ethyl-3-methyltrisilane, 1-methyl-3-n-propyltrisilane, 1-methyl-3-(3,3,3-trifluoropropyl)trisilane, 1-methyl-3-i-propyltrisilane, 1-n-butyl-3-methyltrisilane, 1-t-butyl-3-methyltrisilane, 1-methyl-3-(1-methylpropyl)trisilane, 1-methyl-3-(2-methylpropyl)trisilane, 1-amyl-3-methyltrisilane, 1-n-hexyl-3-methyltrisilane, 1-cyclohexyl-3-methyltrisilane, 1-n-heptyl-3-methyltrisilane, 1-methyl-3-n-octyltrisilane, 1-methyl-3-n-nonyltrisilane, 1-n-decyl-3-methyltrisilane, 1-n-dodecyl-3-methyltrisilane, 1-methyl-3-phenyltrisilane, 1-p-tolyl-3-methyltrisilane, 1-methyl-3-mesityltrisilane, 1-benzyl-3-methyltrisilane, 1-methyl-3-phenethyltrisilane, 1-methyl-3-(trimethylsilylmethyl)trisilane, 1-(p-methylphenethyl)-3-methyltrisilane, 1-ethyl-3-phenyltrisilane, 1-t-butyl-3-phenyltrisilane, 1,1,2-trimethyltrisilane, 1,1,2-triethyltrisilane, 1,1,2-tri-n-propyltrisilane, 1,1,2-tris(3,3,3-trifluoropropyl)trisilane, 1,1,2-tri-n-butyltrisilane, 1,1,2-tri-t-butyltrisilane, 1,1,2-tri(1-methylpropyl)trisilane, 1,1,2-tri(2-methylpropyl)trisilane, 1,1,2-triamyltrisilane, 1,1,2-tri-n-hexyltrisilane, 1,1,2-tricyclohexyltrisilane, 1,1,2-tri-n-heptyltrisilane, 1,1,2-tri-n-octyltrisilane, 1,1,2-tri-n-nonyltrisilane, 1,1,2-tri-n-decyltrisilane, 1,1,2-tri-n-dodecyltrisilane, 1,1,2-triphenyltrisilane, 1,1,2-tri-p-tolyltrisilane, 1,1,2-trimesityltrisilane, 1,1,2-tribenzyltrisilane, 1,1,2-triphenethyltrisilane, 1,1,2-tris(trimethylsilylmethyl)trisilane, 1,1,3-trimethyltrisilane, 1,1,3-triethyltrisilane, 1,1,3-tri-n-propyltrisilane, 1,1,3-tris(3,3,3-trifluoropropyl)trisilane, 1,1,3-tri-n-butyltrisilane, 1,1,3-tri-t-butyltrisilane, 1,1,3-tri(1-methylpropyl)trisilane, 1,1,3-tri(2-methylpropyl)trisilane, 1,1,3-triamyltrisilane, 1,1,3-tri-n-hexyltrisilane, 1,1,3-tricyclohexyltrisilane, 1,1,3-tri-n-heptyltrisilane, 1,1,3-tri-n-octyltrisilane, 1,1,3-tri-n-nonyltrisilane, 1,1,3-tri-n-decyltrisilane, 1,1,3-tri-n-dodecyltrisilane, 1,1,3-triphenyltrisilane, 1,1,3-tri-p-tolyltrisilane, 1,1,3-trimesityltrisilane, 1,1,3-tribenzyltrisilane, 1,1,3-triphenethyltrisilane, 1,1,3-tris(trimethylsilylmethyl)trisilane, 1,2,3-trimethyltrisilane, 1,2,3-triethyltrisilane, 1,2,3-tri-n-propyltrisilane, 1,2,3-tris(3,3,3-trifluoropropyl)trisilane, 1,2,3-tri-n-butyltrisilane, 1,2,3-tri-t-butyltrisilane, 1,2,3-tri(1-methylpropyl)trisilane, 1,2,3-tri(2-methylpropyl)trisilane, 1,2,3-triamyltrisilane, 1,2,3-tri-n-hexyltrisilane, 1,2,3-tricyclohexyltrisilane, 1,2,3-tri-n-heptyltrisilane, 1,2,3-tri-n-octyltrisilane, 1,2,3-tri-n- nonyltrisilane, 1,2,3-tri-n-decyltrisilane, 1,2,3-tri-n-dodecyltrisilane, 1,2,3-triphenyltrisilane, 1,2,3-tri-p-tolyltrisilane, 1,2,3-trimesityltrisilane, 1,2,3-tribenzyltrisilane, 1,2,3-triphenethyltrisilane, 1,2,3-tris(trimethylsilylmethyl)trisilane, 1,1-diethyl-2-methyltrisilane, 1,1-dimethyl-2-n-propyltrisilane, 1,1-dimethyl-2-i-propyltrisilane, 1,1-di-t-butyl-2-methyltrisilane, 1,1-di-n-hexyl-2-methyltrisilane, 1,1-dicyclohexyl-2-methyltrisilane, 1,1-di-n-heptyl-2-methyltrisilane, 1,1-dimethyl-2-n-octyltrisilane, 1,1-di-n-decyl-2-methyltrisilane, 1,1-dimethyl-2-phenyltrisilane, 1,1-di-(p-methylphenethyl)-2-methyltrisilane, 1,1-dimethyl-2-(β-phenethyl)trisilane, 1,1-di-p-tolyl-2-methyltrisilane, 1,1-diphenyl-2-ethyltrisilane, 1,1-di-t-butyl-2-phenyltrisilane, 1,1-di(phenyldimethylsilyl)-2-methyltrisilane, 1,1-bis(trimethylsilyl)-2-methyltrisilane, 1,1-diethyl-3-methyltrisilane, 1,1-dimethyl-3-n-propyltrisilane, 1,1-dimethyl-3-i-propyltrisilane, 1,1-di-t-butyl-3-methyltrisilane, 1,1-di-n-hexyl-3-methyltrisilane, 1,1-dicyclohexyl-3-methyltrisilane, 1,1-di-n-heptyl-3-methyltrisilane, 1,1-dimethyl-3-n-octyltrisilane, 1,1-di-n-decyl-3-methyltrisilane, 1,1-dimethyl-3-phenyltrisilane, 1,1-di-(p-methylphenethyl)-3-methyltrisilane, 1,1-dimethyl-3-(β-phenethyl)trisilane, 1,1-di-p-tolyl-3-methyltrisilane, 1,1-diphenyl-3-ethyltrisilane, 1,1-di-t-butyl-3-phenyltrisilane, 1,1-di(phenyldimethylsilyl)-3-methyltrisilane, 1,1-bis(trimethylsilyl)-3-methyltrisilane, 1,2-diethyl-3-methyltrisilane, 1,2-dimethyl-3-n-propyltrisilane, 1,2-dimethyl-3-i-propyltrisilane, 1,2-di-n-butyl-3-methyltrisilane, 1,2-di-t-butyl-3-methyltrisilane, 1,2-di-n-hexyl-3-methyltrisilane, 1,2-dicyclohexyl-3-methyltrisilane, 1,2-di-n-heptyl-3-methyltrisilane, 1,2-dimethyl-3-n-octyltrisilane, 1,2-di-n-decyl-3-methyltrisilane, 1,2-dimethyl-3-phenyltrisilane, 1,2-di-(p-methylphenethyl)-3-methyltrisilane, 1,2-dimethyl-3-(β-phenethyl)trisilane, 1,2-di-p-tolyl-3-methyltrisilane, 1,2-diphenyl-3-ethyltrisilane, 1,2-di-t-butyl-3-phenyltrisilane, 1,2-di(phenyldimethylsilyl)-3-methyltrisilane, 1,2-bis(trimethylsilyl)-3-methyltrisilane, (trimethylsilyl)methyldisilane, 1-(phenyldimethylsilyl)-1-methyldisilane, 1-(trimethylsilyl)-1-methyldisilane, 1-(phenyldimethylsilyl)-2-methyldisilane, 1-(trimethylsilyl)-2-methyldisilane, 1-bis(phenyldimethylsilyl)-2-methyldisilane, 1-bis(trimethylsilyl)-2-methyldisilane, 1-(phenyldimethylsilyl)-2,2-dimethyldisilane, 1-(trimethylsilyl)-2,2-dimethyldisilane, 1,1,1-tri(phenyldimethylsilyl)-2-methyldisilane, 1,1,1-tri(trimethylsilyl)-2-methyldisilane, 1-(phenyldimethylsilyl)-2,2,2-methyldisilane, 1-(trimethylsilyl)-2,2,2-methyldisilane, 1,1-bis(phenyldimethylsilyl)-2,2-methyldisilane, 1,1-bis(trimethylsilyl)-2,2-methyldisilane, 1,2-bis(phenyldimethylsilyl)-1,2-methyldisilane, 1,2-bis(trimethylsilyl)-1,2-methyldisilane or the like.

The above silane monomers of formulae (IV), (V) and (VI) may be used singly or in any combination.

Turning back to each to the catalysts (a)–(c) referred to above for use in the dehydrogenative condensation of the starting silane monomers, the metal of Group 3B of the Periodic Table includes samarium, europium, and ytterbium; the metal of Group 4B includes titanium, zirconium, and hafnium; the metal of Group 5B includes vanadium, niobium, and tantalum; the metal of Group 6B includes chromium, molybdenum, and tungsten; the metal of Group 7B includes manganese, technetium, and rhenium; the metal of Group 8B includes iron, ruthenium, osmium, cobalt, rhodium, iridium, nickel, palladium, and platinum. Compounds of these metals may be also used.

Eligible metallic compounds of the Group 4B metal are halogen compounds, acetylacetonate, alkoxy compounds, aryloxy compounds, alkoxyhalogen compounds, aryloxyhalogen compounds and such compounds which have conjugated π-bond substituents such as cyclopentadienyl, alkylcyclopentadienyl, indenyl and like substituted cyclopentadienyl groups.

Examples of titanium compounds include (η-cycloheptatrienyl)(η-cyclopentadienyl)titanium, titanium hydride, dicarbonylbis(η-cyclopentadienyl)titanium, bis(η-pentamethylcyclopentadienyl)titanium, titanium trichloride, chlorobis(η-cyclopentadienyl)titanium, dichloro(η-cyclopentadienyl)titanium, titanium tetrachloride, titanium tetrabromide, titanium tetraiodide, trichloromethyltitanium, methyltriisopropoxytitanium, titanium tetraethoxide, titanium tetrapropoxide, titanium tetraisopropoxide, titanium tetrabutoxide, dihydridebis(η-pentamethylcyclopentadiethyl)titanium, trichloro(η-cyclopentadienyl)titanium, dichlorobis (η-cyclopentadienyl)titanium, dichlorobis (η-methylcyclopentadienyl)titanium, dichlorobis (η-dimethylcyclopentadienyl)titanium, dichlorobis (η-trimethylcyclopentadienyl)titanium, dichlorobis (η-pentamethylcyclopentadienyl)titanium, dichlorobis (η-trifluoromethylcyclopentadienyl)titanium, dichlorobis(η-trimethylsilylcyclopentadienyl)titanium, dichloro(η-pentamethylcyclopentadienyl)(η-cyclopentadienyl)titanium, dichloro(η-trifluoromethylcyclopentadienyl)(η-cyclopentadienyl)titanium, dichloromethylenebis(η-cyclopentadienyl)titanium, dichloroethylenebis(η-cyclopentadienyl)titanium, dichloropropylenebis(η-cyclopentadienyl)titanium, dichlorodimethylsilylenebis(η-cyclopentadienyl)titanium, dichlorobis(η-indenyl)titanium, dichlorobis(η-methylindenyl)titanium, dichlorobis(η-dimethylindenyl)titanium, dichlorobis(η-trimethylsilylindeyl)titanium, dichloromethylenebis(η-indenyl)titanium, dichloroethylenebis(η-indenyl)titanium, dichloropropylenebis(η-indenyl)titanium, dimethylbis(η-cyclopentadienyl)titanium, dimethylbis (η-methylcyclopentadienyl) titanium, dimethylbis (η-pentamethylcyclopentadienyl) titanium, dimethylbis (η-trimethylsilylcyclopentadienyl) titanium, dimethylbis (η-indenyl) titanium, diphenylbis(η-cyclopentadienyl)titanium, diphenylbis(η-methylcyclopentadienyl)titanium, dibenzylbis(η-cyclopentadienyl)titanium, bis(trimethylsilylmethyl)bis(η-cyclopentadienyl)titanium, dimethoxybis(η-cyclopentadienyl)titanium, diethoxybis(η-cyclopentadienyl)titanium, dibutoxybis(η-cyclopentadienyl)titanium and diphenoxybis(η-cyclopentadienyl)titanium.

Examples of zirconium compounds include bis(η-cyclooctatetraene)zirconium, zirconium hydroxide, bis(η-cyclopentadienyl)(η-1,3-butadiene)zirconium, dicarbonylbis(η-cyclopentadienyl)zirconium, chlorobis(η-cyclopentadienyl)zirconium, benzylbis(η-cyclopentadienyl)zirconium, trimethylsilylmethylbis(η-cyclopentadienyl)zirconium, zirconium tetrachloride, zirconium acetylacetonato, zirconiumtetraethoxide, zirconiumtetrabutoxide, tetraallylzirconium, trichloro(η-pentamethylcyclopentadienyl)zirconium, tribromo(η-cyclopentadienyl)zirconium, bis(η-cyclopentadienyl)dihydride zirconium, chlorobis(η-cyclopentadienyl)hydride zirconium, bis(tetrahydroborate)bis(η-cyclopentadienyl)zirconium, dichlorobis(η-cyclopentadienyl)zirconium, dichlorobis(η-methylcyclopentadienyl)zirconium, dichlorobis(η-dimethylcyclopentadienyl)zirconium, dichlorobis(η-trimethylcyclopentadienyl)zirconium, dichlorobis(η-pentamethylcyclopentadienyl)zirconium, dichlorobis(η-trifluoromethylcyclopentadienyl)zirconium, dichlorobis(η-trimethylsilylcyclopentadienyl)zirconium, dichloro(η-pentamethylcyclopentadienyl)(η-cyclopentadienyl)zirconium, dichloro(η- triflluromethylcyclopentadienyl)(η-cyclopentadienyl)zirconium, dichloromethylenebis(η-cyclopentadienyl)zirconium, dichloroethylenebis(η-cyclopentadienyl)zirconium, dichloropropylenebis(η-cyclopentadienyl)zirconium, dichlorodimethylsilylenebis(η-cyclopentadienyl)zirconium, dichlorobis(η-indenyl)zirconium, dichlorobis(η-methylindenyl)zirconium, dichlorobis(η-dimethylindenyl)zirconium, dichlorobis(η-trimethylsilylindenyl)zirconium, dichloromethylenebis(η-indenyl)zirconium, dichloroethylenebis(η-indenyl)zirconium, dichloropropylenebis(η-indenyl)zirconium, dimethylbis(η-cyclopentadienyl)zirconium, dimethylbis(η-pentamethylcyclopentadienyl)zirconium, dimethylbis(η-indenyl)zirconium, diphenylbis(η-cyclopentadienyl)zirconium, diphenylbis(η-methylcyclopentadienyl)zirconium, dibenzylbis(η-cyclopentadienyl)zirconium, bis(trimethylsilylmethyl)bis(η-cyclopentadienyl)zirconium, dimethoxybis(η-cyclopentadienyl)zirconium, diethoxybis(η-cyclopentadienyl)zirconium, dibutoxybis(η-cyclopentadienyl)zirconium and diphenoxybis(η-cyclopentadienyl)zirconium.

Examples of hafnium compounds include bis(ηbutadiene)[1,2-bis(dimethylphosphino)ethane]hafnium, dicarbonylbis(η-cyclopentadienyl)hafnium, trimethylsilylmethylbis(η-isopropylcyclopentadienyl)hafnium, tetrabenzylhafnium, trichloro(η-cyclopentadienyl)hafnium, chlorobis(η-cyclopentadienyl)hydride hafnium, dihydridobis(η-cyclopentadienyl)hafnium, bis(tetrahydroborate)bis(η-methylcyclopentadienyl)hafnium, dichlorobis(η-cyclopentadienyl)hafnium, dichlorobis(η-methylcyclopentadienyl)hafnium, dichlorobis(η-dimethylcyclopentadienyl)hafnium, dichlorobis(η-trimethylcyclopentadienyl)hafnium, dichloro(η-pentamethylcyclopentadienyl)(η-cyclopentadienyl)hafnium, dichloro(η-trifluoromethylcyclopentadienyl)(η-cyclopentadienyl)hafnium, dichlomethylenebis(η-cyclopentadienyl)hafnium, dichloroethylenebis(η-cyclopentadienyl)hafnium, dichlopropylenebis(η-cyclopentadienyl)hafnium, dichlorodimethylsilylenebis(η-cyclopentadienyl)hafnium, dichlorobis(η-indenyl)hafnium, dichlorobis(η-methylindenyl)hafnium, dichlorobis(η-dimethylindenyl)hafnium, dichlorobis(η-trimethylindenyl)hafnium, dichloromethylenebis(η-indenyl)hafnium, dichloroethylenebis(η-indenyl)hafnium, dichloropropylenebis(η-indenyl)hafnium, dimethylbis(η-cyclopentadienyl)hafnium, dimethylbis(η-pentamethylcyclopentadienyl)hafnium, dimethylbis(η-indenyl)hafnium, diphenylbis(η-cyclopentadienyl)hafnium, diphenylbis(η-methylcyclopentadienyl)hafnium, dibenzylbis(η-cyclopentadienyl)hafnium, bis(trimethylsilylmethyl)bis(η-cyclopentadienyl)hafnium, dimethoxybis(η-cyclopentadienyl)hafnium, diethoxybis(η-cyclopentadienyl)hafnium, dibutoxybis(η-cyclopentadienyl)hafnium and diphenoxybis(η-cyclopentadienyl)hafnium.

Examples of cobalt compounds include halogen compounds, acetate, sulfur-containing organic compounds, carbonyl compounds, phosphorus-containing organic compounds, and such compounds which have conjugated π-bond substituents such as cyclopentadienyl, alkylcyclopentadienyl, indenyl and like substituted cyclopentadienyl groups. Such cobalt compounds exemplarily include hexacarbonylbis(tributylphosphine)dicobalt, hexacarbonyl-μ-(diphenylacetylene)dicobalt, tetracarbonylbis(μ-butadiene)dicobalt, dodecarbonyltetracobalt, hydridotetracarbonylcobalt, tetracarbonyl(trimethylsilyl)cobalt, (η-allyl)tricarbonylcobalt, hydrido(dinitrogen)tris(triphenylphosphine)cobalt, tetrakis(trimethylphosphine)methylcobalt, dicarbonyl(η-cyclopentadienyl)cobalt, bis[(μ-carbonyl)(η-cyclopentadienyl)cobalt], tris[(μ-carbonyl)(η-cyclopentadienyl)cobalt], dicarbonyl(η-pentamethylcyclopentadienyl)cobalt, bis(trimethylphosphido)(η-cyclopentadienyl)cobalt, chlorotris(triphenylphosphine)cobalt, (η-cyclopentadienyl)bis(triphenylphosphine)cobalt, (η-cyclopentadienyl)bis(η-ethylene)cobalt, (η-cyclopentadienyl)(η-1,5-cyclooctadiene)cobalt, (η-cyclopentadienyl)(η-cyclohexadiene)cobalt, cobalt acetate, cobalt(acetylacetonato), cobalt chloride, cobalt bromide, cobalt iodide, cobalt thiocyanate, bis(η-cyclopentadienyl)cobalt, carbonyl(η-cyclopentadienyl)diiodocobalt, (η-cyclopentadienyl)(triphenylphosphine)diiodocobalt, bis(η-cyclopentadienyl)cobalt tribromide, (η-cyclopentadienyl)(η-cyclohexadienyl)cobalt iodide and (η-benzene)(η-cyclopentadienyl)cobalt tetrafluoroborate.

Examples of nickel compounds are halogen compounds, acetate, nitrogen-containing organic compounds, sulfur-containing organic compounds, carbonyl compounds, phosphorus-containing compounds and such compounds which have conjugated π-bond substituents such as cyclopentadienyl, alkylcyclopentadienyl, indenyl and like substituted cyclopentadienyl groups. Specific examples include tetracarbonylnickel, dicarbonylbis(triphenylphosphine)nickel, bis(1,5-cyclooctadiene)nickel, (η-ethylene)bis(triphenylphosphine)nickel, tetrakis(triphenylphosphine)nickel, tetrakis(t-butyl isocyanide)nickel, μ-(dinitrogen)bis[bis(tricyclohexylphosphine)nickel], nickelacetate, nickel(acetylacetonato), nickel chloride, nickel bromide, dichloro[1,2-bis(diphenylphosphino)ethane]nickel, trans-bis(1,3-butadiynyl)bis(tributylphosphine)nickel, dimethylbis(trimethylphosphine)nickel, diethyl(2,2'-bipyridyl)nickel, trans-bromo(phenyl)bis(triethylphosphine)nickel, tetramethylenebis(triphenylphosphine)nickel, trans-chloro(hydride)bis(tricyclohexylphosphine)nickel, bis(η-cyclopentadienyl)nickel, chloro(η-cyclopentadienyl)(triphenylphosphine)nickel, methyl(η-cyclopentadienyl)(triphenylphosphine)nickel, (η-allyl)(η-cyclopentadienyl)nickel, (η-1,5-cyclooctadiene)(η-cyclopentadienyl)nickeltetrafluoro borate, bis(η-allyl)nickel, (η-allyl)bromo(triphenylphosphine)nickel, and bis(η-cyclopentadienyl)di(μ-carbonyl)dinickel.

Examples of ruthenium compounds include ruthenium carbon, ruthenium alumina, dodecacarbonyltri ruthenium, tetra-μ-hydridedodecacarbonyltetraruthenium, tetracarbonyl(trimethylphosphido)ruthenium, pentakis(trimethylphosphido)ruthenium, tricarbonyl(cyclooctatetraene)ruthenium, tricarbonyl(1,5-cyclooctadiene)ruthenium, tetracarbonylbis(η-cyclopentadienyl)diruthenium, tetracarbonylbis(η-pentamethylcyclopnetadienyl)diruthenium, dicarbonyltris(triphenylphosphine)ruthenium, diacetatodicarbonylbis(triphenylphosphine)ruthenium, di-μ-chlorobis(chlorotricarbonylruthenium), dichlorotris(triphenylphosphine)ruthenium, carbonylchlorohydridotris(triphenylphosphine)ruthenium, dihydridotetrakis(triphenylphosphine)ruthenium, trans-dichlorotetrakis(t- butyl isocyanide)ruthenium, bis(η-cyclopentadienyl)ruthenium, chloro(η-cyclopentadienyl)bis(triphenylphosphine)ruthenium, hydrido(η-cyclopentadienyl)bis(triphenylphosphine)ruthenium, cyclopentadienyltris(trimethylphosphine)rutheniumhexafluorophosphate, chlorodicarbonyl(η-cyclopentadienyl)ruthenium, hydrido(cyclopentadienyl)(1,5-cyclooctadiene)ruthenium, chloro(cyclopentadienyl)(1,5-cyclooctadiene)ruthenium, tricarbonyl(pentamethylcyclopentadienyl)rutheniumtetrafluoroborate, ruthenium(acetylacetonate), ruthenium chloride, dichloro(pentamethylcyclopentadienyl)ruthenium, dichloro(pentamethylcyclopentadienyl)(triphenylphosphine)ruthenium, tetrahydridotris-(triphenylphosphine)ruthenium, trichloro(pentamethylcyclopentadienyl)ruthenium, trihydro(pentamethylcyclopentadienyl)(triphenylphosphine) ruthenium and dichloro(η-allyl)(cyclopentadienyl)ruthenium.

Examples of rhodium compounds include rhodium carbon, rhodium alumina, rhodium silica, octacarbonyldirhodium, dodecacarbonyltetrarhodium, rhodium(dicarbonyl)(acetylacetonato), di-μ-chlorotetracarbonyldirhodium, hydridotetracarbonylrhodium, chlorotris(triphenylphosphine)rhodium, tetrakis(trimehtylphosphine)rohdium chloride, trans-[chlorocarbonylbis(tricyclohexylphosphine)rhodium], hydridotris(triisopropylphosphine)rhodium, hydridotetrakis(triphenylphosphine)rhodium, hydridotetrakis(triisopropylphosphido)dirhodium, di-μ-chloro-tetra(η-ethylene)dirhodium, di-μ-chlorotetrakis(cyclooctene)dirhodium, di-μ-chlorobis(cyclooctadiene)dirhodium, di-μ-chloro-bis(μ-tetraphenylcyclobutadiene)dirhodium, 2,4-pentandionatobis(ethylene)rhodium, bis(cycloocta-1,5-diene)rhodium, 1,5-cyclooctadienebis(acetonitrile)rhodiumtetrafluoro borate, diammine cyclooctadienerhodiumhexafluorophosphate, rhodium acetate, rhodium(acetylacetonate), rhodium chloride, rhodium bromide, di-μ-chlorodichlorobis(pentamethylcyclopentadienyl)dirhodium, di-μ-carbonyl-bis(pentamethylcyclopentadienyl)dirhodium, tris(acetonitrile)pentamethlcyccl opentadienylrhodiumdihexafluorophosphate, (1,4-butandiel)(η-pentamethylcyclopentadienyl)(triphenylphosphine)rhodium, di-μ-chloro-tetralkis(η-allyl)dirhodium, tris(η-allyl)rhodium, hydridooctaethylporphyrinatorhodium, dimethyl-di-μ-methylenebis(pentamethylecyclopentadienyl)dirhodium and dihydridobis(triethylsilyl)pentamethylcyclopentadienylrhodium.

Examples of palladium compounds include palladium carbon, palladium alumina, tetrakis(triphenylphosphine)palladium, bis(tricyclohexylphosphine)palladium, tetrakis(triethylphosphido)palladium, carbonyltris(triphenylphosphine)palladium, (η-ethylene)bis(triphenylphosphine)palladium, bis(cycloocta-1,5-diene)palladium, tris-(dibenzylideneacetone)dipalladium, dichloro-μ-bis [bis(diphenylphosphino)methane]dipalladium, palladium acetate, palladium(acetylacetonato),palladium chloride, palladium iodide, dichlorobis(benzonitrile)palladium, dichloro(1,5-cyclooctadiene)palladium, dichlorobis(triphenylphosphine)palladium, di-μ-chloro-dichlorobis(isocyanido)dipalladium, di-μ-chloro-dichlobis(tripehnylphosphine)dipalladium, trans-[bis(t-butylisocyanide)dichloropalladium], chloromethyl(1,5-cyclooctadiene)palladium, dimethylbis(triethylphosphine)palladium, trans-[bromo(methyl)bis(triethylphosphine)palladium], trans-chloro(phenylethynyl)bis(tributylphosphine)palladium, cyclopentadienyl(phenyl)(triethylphosphine)palladium, η-allyl(pentamethylcyclopentadienyl)palladium, η-allyl(1,5-cyclooctadiene)palladiumtetrafluoroborate and di-μ-chlorobis(η-allyl)dipalladium.

Examples of iridium compounds include dodecacarbonyltetrairidium, hexacarbonylhexairidium, di-μ-chlorotetrakis(cyclooctene)diiridium, di-μ-chlorotetrakis(ethylene)diiridium, di-μ-chlorobis(1,5-cyclooctadiene)diiridium, chlorotris(triphenylphosphine)iridium, chlorocarbonylbis-(triphenylphosphine)iridium, chloroethylenebis(triphenylphosphine)iridium, chloro(dinitrogen)bis(triphenylphosphine)iridium, (pentamethylcyclopentadienyl)dicarbonyliridium, pentamethylcyclopentadienylbis(ethylene)iridium, carbonylhydridetris(triphenylphosphine)iridium, chlorodicarbonyl(p-toluidine)iridium, carbonylmethylbis(triphenylphosphine)iridium, iridium(acetylacetonato), iridium chloride, tris(η-allyl)iridium, di-μ-chlorodichlorobis(pentamethylcyclopentadienyl)diiridium, trichlorotris(triethylphosphine)diiridium, dihydrido(pentamethylcyclopentadienyl)trimethylphosphineiridium and pentahydridebis(trimethylphosphine)iridium.

Examples of platinum compounds include platinum carbon, platinum alumina, bis(dibenzilidene acetone)platinum, tris(ethylene)platinum, tetrakis(triphenylphosphine)platinum, tris(triphenylphosphine)platinum, tetrakis(triphenylphosphido)platinum, carbonyltris(tripehnylphosphine)platinum, bis(triphenylphosphine)(diphenylacetylene)platinum, bis(triphenylphosphine)(trans-stilbene)platinum, bis [carbonyl(pentamethylcyclopentadienyl)platinum], μ-[bis-(diphenylphosphino)methane]-bis(chloroplatinum), platinum(acetylacetonato), platinum dichloride, platinum dibromide, cis-bis(benzonitryl)dichloroplatinum, cis-dichlorobis(acetonitryl)platinum, trans-dichlorobis(acetonitryl)platinum, dichloro(η-1,5-cyclooctadiene)platinum, cis-dichlorobis(tributylphosphine)platinum, trans-dichlorobis(tributylphosphine)platinum, cis-[dichloro(phenylisocyanide)(triphenylphosphine)platinum], cis-[dichloro(diaminocarbene)(triethylphosphine)platinum], trichloro(η-ethylene)potassium platinate, di-μ-chloro-dichloro(ethylene)diplatinum, bis(1,5-cyclooctadiene)platinum, trans-hydridechlorobis(triethylphosphine)platinum, dimethyl(1,5-cyclooctadiene)platinum, trans-[iodo(methyl)bis(triethylphosphine)platinum], cis-[chloro(methyl)bis(dimethylphenylphosphine)platinum]dibutylbis(triphenylphosphine)platinum and platinum tetrachloride.

The above listed metals and their compounds may be used in combination.

The silyl compound used as the catalyst in the dehydrogenative condensation of a starting monomer includes phenyldimethylsilyllithium, diphenylmethylsilyllithium, t-butyldiphenylsilyllithium, triphenylsilyllithium, tris(trimethylsilyl)silyllithium, trimethylsilylsodium, triethylsilylsodium, tri-n-propylsilylsodium, tri-i-propylsilylsodium, tri-n-butylsilylsodium, tri-n-hexylsilylsodium, triphenylsilylsodium, ethyldimethylsilylsodium, n-propyldimethylsilylsodium, i-propyldimethylsilylsodium, n-butyldimethylsilylsodium, t-butyldimethylsilylsodium, n-hexyldimethlsilylsodium, cyclohexyldimethylsilylsodium, n-octyldimethylsilylsodium, n-decyldimethylsilylsodium, phenyldimethylsilylsodium, benzyldimethylsilylsodium, phenethyldimethylsilylsodium, di-n-butylmethlsilylsodium, diphenylmethylsilylsodium, t-butyldiphenylsilylsodium, tris(trimethylsilyl)silisodium, trimethylsilylpotassium, triethylsilylpotassium, tri-n-propylsilylpotassium, tri-i-propylsilylpotassium, tri-n-butylsilylpotassium, tri-n-hexylsilylpotassium, triphenylsilylpotassium, ethyldimethylsilylpotassium, n-propyldimethylsilylpotassium, i-propyldimethylsilylpotassium, n-butyldimethylsilylpotassium, t-butyldimethylsilylpotassium, n-hexyldimethylsilylpotassium, cyclohexyldimethylsilylpotassium, n-octyldimethylsilylpotassium, n-decyldimethylsilylpotassium, phenyldimethylsilylpotassium, benzyldimthylsilylpotassium, phenethyldimethylsilylpotassium, di-n-butylmethylsilylpotassium, diphenylmethylsilylpotassium, t-butyldiphenylsilylpotassium and tris(trimethylsilyl)silylpotassium. Two or more of these silyl compounds may be combined. The silyl compounds may contain ligands such as ether and tetrahydrofuran.

The metal (heavy) hydride of formula (IX) exemplarily includes LiH, NaH, KH, $CaH_2$, $AlH_3$, $MeAlH_2$, $EtAlH_2$, $i-PrAlH_2$, $n-BuAlH_2$, $i-BuAlH_2$, $sec-BuAlH_2$, $t-BuAlH_2$, $Me_2AlH_2$, $Et_2AlH$, $n-Pr_2AlH$, $i-Pr_2AlH$, $n-Bu_2AlH$, $i-Bu_2AlH$, $sec-Bu_2AlH$, $t-Bu_2AlH$, $LiAlH_4$, $LiAl(Et)_2H_2$, $LiAl(n-Pr)_2H_2$, $LiAl(i-Pr)_2H_2$, $LiAl(n-Bu)_2H_2$, $LiAl(i-Bu)_2H_2$, $LiAl(sec-Bu)_2H_2$, $LiAl(t-Bu)_2H_2$, $LiAl(Et)_3H$, $LiAl(n-Pr)_3H$, $LiAl(i-Pr)_3H$, $LiAl(n-Bu)2H$, $LiAl(i-Bu)3H$, $LiAl(sec-Bu)3H$, $LiAl(OMe)3H$, $LiAl(OEt)_3H$, $LiAl(O-t-Bu)_3H$, $NaAl(OCH_2CH_2-OMe)_3H$, $BH_3$, $[(CH_3)_2CHCH(CH_3)]_2BH$, $LiBH_4$, $LiB(sec-Bu)_3H$, $LiB(Et)3H$, $Li(9-BBN)H$, $NaBH_4$, $KBH_4$, $Me_4NBH_4$, $Et_4NBH_4$, LiD, NaD, KD, $CaD_2$, $AlD_3$, $MeAlD_2$, $EtAlD_2$, $n-PrAlD_2$, $i-PrAlD_2$, $n-BuAlD_2$, $i-BuAlD_2$, $sec-BuAlD_2$, $t-BuAlD_2$, $Me_2AlD$, $Et_2AlD$, $n-Pr_2AlD$, $i-Pr_2AlD$, $n-Bu_2AlD$, $i-Bu_2AlD$, $sec-Bu_2AlD$, $t-Bu_2AlD$, $LiAlD_4$, $LiAl(Et)_2D_2$, $LiAl(n-Pr)_2D_2$, $LiAl(i-Pr)_2D_2$, $LiAl(n-Bu)_2D_2$, $LiAl(i-Bu)_2D_2$, $LiAl(sec-Bu)_2D_2$, $LiAl(t-Bu)_2D_2$, $LiAl(Et)_3D$, $LiAl(n-Pr)_3D$, $LiAl(i-Pr)_3D$, $LiAl(n-Bu)_3D$, $LiAl(i-Bu)_3D$, $LiAl(sec-Bu)_3D$, $LiAl(OMe)_3D$, $LiAl(OEt)_3D$, $LiAl(O-t-Bu)_3D$, $NaAl(OCH_2CH_2OMe)_3D$, $BD_3$, $[(CH_3)_2CHCH(CH_3)]_2BD$, $LiBD_4$, $LiB(sec-Bu)_3D$, $LiB(Et)_3D$, $Li(9-BBN)D$, $NaBD_4$, $KBD_4$, $Me_4NBD_4$ and $Et_4NBD_4$. Two or more of these metal hydrides may be combined at will.

The metal and/or metallic compound is/are used in an amount usually of 0.01–10 mols, preferably 0.1–10 mols, preferably 0.1–5 mols per 100 mols of the hydrosilane monomer. The silyl compound and the metal hydride are usually used in an amount of 0.005–50 mols, preferably 0.05–20 mols per 100 mols of the hydrosilane monomer. The ratio of the metal and/or metallic compound to the silyl compound is usually in the range of 1/0.01–1/100, preferably 1/0.1 –1/50 by mol. The ratio of the metal and/or metallic compound to the metal hydride is usually in the range of 1/0.01–1/100, preferably 1/0.1–1/50 by mol.

The catalyst used in the invention may be added with crown ethers such as 12-crown-4,15-crown-5, 18-crown-6, dibenzo-12-crown-4, dibenzo-15-crown-5 and dibenzo-18-crown-6, and diamines such as tetramethyl ethylene diamine. These additives are usually used in an amount of 0.005–50, preferably 0.05–20 mols per 100 mols of the hydrosilane monomer.

The dehydrogenative condensation reaction according to the invention is usually effected at a temperature of 0°–250° C., preferably 25°–210° C., at a pressure usually of 1 mmHg–200 kg/cm², preferably atmospheric to 100 kg/cm² for a timelength of usually 5 minutes to 24 hours, preferably 30 minutes to 3 hours though dependent upon the reaction temperature and the amount of catalyst and starting monomer. The reaction may be carried out in the presence or absence of catalysts and with use of solvents such as hydrocarbon solvents including toluene, xylene, heptane, decane and dodecane, ether solvents including diethylether, isopropylether, methylbutylether, dimethoxyethane, tetrahydrofuran and dioxane, amide solvents including dimethylformamide and hexamethylphosphoric amide, ester solvents including ethylacetate and butylacetate and sulfoxides including dimethylsulfoxide.

The catalyst components and the monomer components may be simultaneously admixed, or the latter may be added to the former or vice versa. The solvents and the additives may be added at any suitable time point.

The dehydrogenative condensation reaction is preferably conducted in an atmosphere of inert gas such as argon and nitrogen regardless of the use of solvents.

The Kipping method employed for the production of silicon polymers according to the invention comprises reacting one or more of halogenosilanes of the group consisting of a halogenomonosilane of the formula (IV), (V) and (VI) hereinabove identified, in the presence of an alkali metal and/or an alkaline earth metal to form a condensation product and subjecting the resulting condensation product to thermal decomposition.

The halogenomonosilane of formula (IV) preferably includes tetrachlorosilane, i-propyltrichlorosilane, t-butyltrichlorosilane, (1-methylpropyl)trichlorosilane, cyclohexyltrichlorosilane, (1,1,2-trimethylpropyl)trichlorosilane, α-phenethyltrichlorosilane, cumyltrichlorosilane, (trimethylsilyl)trichlorosilane, di-i-propyldichlorosilane, di-t-butyldichlorosilane, di(1-methylpropyl)dichlorosilane, dicyclohexyldichlorosilane, di-α-phenethyldichlorosilane, bis(trimethylsilyl)dichlorosilane or the like, and further exemplarily includes tetrabromosilane, i-propyltribromosilane, t-butyltribromosilane, (1-methylpropyl)tribromosilane, cyclohexyltribromosilane, (1,1,2-trimethylpropyl)tribromosilane, αphenethyltribromosilane, cumyltribromosilane, (trimethylsilyl)tribromosilane, di-i-propyltribromosilane, di-t-butyltribromosilane, di(1-methylpropyl)tribromosilane, dicyclohexyltribromosilane, di-α-phenethyltribromosilane, bis(trimethylsilyl)tribromosilane, tetraiodosilane, i-propyltriiodosilane, t-butyltriiodosilane, (1-methylpropyl)triiodosilane, cyclohexyltriiodosilane, (1,1,2-trimethylpropyl)triiodosilane, α-phenethyltriiodosilane, cumyltriiodosilane, (trimethylsilyl)triiodosilane, di-i-propyldiiodosilane, di-t-butyldiiodosilane, di(1-methylpropyl)diiodosilane, dicyclohexyltriiodosilane, di-α-phenethyltriiodosilane, bis(trimethylsilyl)triiodosilane and the like.

The halogenodisilane of formula (V) preferably includes hexachlorosisilane, i-propylpentachlorodisilane, t-butylpentachlorodisilane, (1-methylpropyl)pentachlorodisilane, cyclohexylpentachlorodisilane, (1,1,2-trimethylpropyl)pentachlorodisilane, α-phenethylpentachlorodisilane, cumylpentachlorodisilane, (trimethylsilyl)pentachlorodisilane, 1,1-di-i-propyltetrachlorodisilane, 1,1-di-t-butyltetrachlorodisilane, 1,1-di(1-methylpropyl)tetrachlorodisilane, 1,1-dicyclohexyltetrachlorodisilane, 1,1-di-α-phenethyltetrachlorodisilane, 1,1-bis(trimethylsilyl)tetrachlorodisilane, 1,1-di-i-propyltetrachlorodisilane, 1,1-di-t-butyltetrachlorodisilane, 1,2-di(1-methylpropyl)tetrachlorodisilane, 1,2-dicyclohexyltetrachlorodisilane, 1,2-di-α-phenethyltetrachlorodisilane, 1,2-bis(trimethylsilyl)tetrachlorodisilane or the like, and further exemplarily includes 1,1,1-tri-i-propyltrichlorodisilane, 1,1,1-tri-t-butyltrichlorodisilane, 1,1,1-tri(1-methylpropyl)trichlorodisilane, 1,1,1-tricyclohexyltrichlorodisilane, 1,1,1-tri-α-phenethyltrichlorodisilane, 1,1,1-tris(trimethylsilyl)trichlorodisilane, 1,1,1-tri-i-propyltrichlorodisilane, 1,1,1-tri-t-butyltrichlorodisilane, 1,1,2-tri(1-methylpropyl)trichlorodisilane, 1,1,2-tricyclohexyltrichlorodisilane, 1,1,2-tri-α-phenethyltrichlorodisilane, 1,1,2-tris(trimethylsilyl)trichlorodisilane, hexabromodisilane, i-propylpentabromodisilane, t-butylpentabromodisilane, (1-methylpropyl)pentabromodisilane, cyclohexylpentabromodisilane, (1,1,2-trimethylpropyl)pentabromodisilane, α-phenethylpentabromodisilane, cumylpentabromodisilane, (trimethylsilyl)pentabromodisilane, 1,1-di-i-propyltetrabromodisilane, 1,1-di-t-butyltetrabromodisilane, 1,1-di(1-methylpropyl)tetrabromodisilane, 1,1-dicyclohexyltetrabromodisilane, 1,1-di-α-phenethyltetrabromodisilane, 1,1-bis(trimethylsilyl)tetrabromodisilane, 1,1-di-i-propyltetrabromodisilane, 1,1-di-t-butyltetrabromodisilane, 1,2-di(1-methylpropyl)tetrabromodisilane, 1,2-dicyclohexyltetrabromodisilane, 1,2-di-α-phenethyltetrabromodisilane, 1,2-bis(trimethylsilyl)tetrabromodisilane, 1,1,1-tri-i-propyltribromodisilane, 1,1,1-tri-t-butyltribromodisilane, 1,1,1-tri(1-methylpropyl)tribromodisilane, 1,1,1-tricyclohexyltribromodisilane, 1,1,1-tri-α-phenethyltribromodisilane, 1,1,1-tris(trimethylsilyl)tribromodisilane, 1,1,1-tri-i-propyltribromodisilane, 1,1,1-tri-t-butyltribromodisilane, 1,1,2-tri(1-methylpropyl)tribromodisilane, 1,1,2-tricyclohexyltribromodisilane, 1,1,2-tri-α-phenethyltribromodisilane, 1,1,2-tris(trimethylsilyl)tribromodisilane, hexaiododisilane, i-propylpentaiododisilane, t-butylpentaiododisilane, (1-methylpropyl)pentaiododisilane, cyclohexylpentaiododisilane, (1,1,2-trimethylpropyl)pentaiododisilane, α-phenethylpentaiododisilane, cumylpentaiododisilane, (trimethylsilyl)pentaiododisilane, 1,1-di-i-propyltetraiododisilane, 1,1-di-t-butyltetraiododisilane, 1,1-di(1-methylpropyl)tetraiododisilane, 1,1-dicyclohexyltetraiododisilane, 1,1-di-α-phenethyltetraiododisilane, 1,1-bis(trimethylsilyl)tetraiododisilane, 1,1-di-i-propyltetraiododisilane, 1,1-di-t-butyltetraiododisilane, 1,2-di(1-methylpropyl)tetraiododisilane, 1,2-dicyclohexyltetraiododisilane, 1,2-di-α-phenethyltetraiododisilane, 1,2-bis(trimethylsilyl)tetraiododisilane, 1,1,1-tri-i-propyltriiododisilane, 1,1,1-tri-t-butyltriiododisilane, 1,1,1-tri(1-methylpropyl)triiododisilane, 1,1,1-tricyclohexyltriiododisilane, 1,1,1-tri-α-phenethyltriiododisilane, 1,1,1-tris(trimethylsilyl)triiododisilane, 1,1,1-tri-i-propyltriiododisilane, 1,1,1-tri-t-butyltriiododisilane, 1,1,2-tri(1-methylpropyl)triiododisilane, 1,1,2-tricyclohexyltriiododisilane, 1,1,2-tri-α-phenethyltriiododisilane, 1,1,2-tris(trimethylsilyl)triiododisilane and the like.

The halogenotrisilane of formula (VI) preferably includes octachlorotrisilane, and further exemplarily includes 1-i-propylheptachlorotrisilane, 1-t-butylheptachlorotrisilane, 1-(1-methylpropyl)heptachlorotrisilane, 1-cyclohexylheptachlorotrisilane, 1-(1,1,2-trimethylpropyl)heptachlorotrisilane, 1-α-phenethylheptachlorotrisilane, 1-cumylheptachlorotrisilane, 1-(trimethylsilyl)heptachlorotrisilane, 2-i-propylheptachlorotrisilane, 2-t-butylheptachlorotrisilane, 2-(1-methylpropyl)heptachlorotrisilane, 2-cyclohexylheptachlorotrisilane, 2-(1,1,2-trimethylpropyl)heptachlorotrisilane, 2-α-phenethylheptachlorotrisilane, 2-cumylheptachlorotrisilane, 2-(trimethylsilyl)heptachlorotrisilane, 1,1-di-i-propylhexachlorotrisilane, 1,1-di-t-butylhexachlorotrisilane, 1,1-di(1-methylpropyl)hexachlorotrisilane, 1,1-dicyclohexylhexachlorotrisilane, 1,1-di-α-phenethylhexachlorotrisilane, 1,1-bis(trimethylsilyl)hexachlorotrisilane, 1,2-di-i-propylhexachlorotrisilane, 1,2-di-t-butylhexachlorotrisilane, 1,2-di(1-methylpropyl)hexachlorotrisilane, 1,2-dicyclohexylhexachlorotrisilane, 1,2-di-α-phenethylhexachlorotrisilane, 1,2-bis(trimethylsilyl)hexachlorotrisilane, 1,3-di-i-propylhexachlorotrisilane, 1,3-di-t-butylhexachlorotrisilane, 1,3-di(1-methylpropyl)hexachlorotrisilane, 1,3-dicyclohexylhexachlorotrisilane, 1,3-di-α-phenethylhexachlorotrisilane, 1,3-bis(trimethylsilyl)hexachlorotrisilane, 1,1,1-tri-i-propylpentachlorotrisilane, 1,1,1-tri-t-butylpentachlorotrisilane, 1,1,1-tri(1-methylpropyl)pentachlorotrisilane, 1,1,1-tricyclohexylpentachlorotrisilane, 1,1,1-tri-α-phenethylpentachlorotrisilane, 1,1,1-tris(trimethylsilyl)pentachlorotrisilane, 1,1,2-tri-i-propylpentachlorotrisilane, 1,1,2-tri-t-butylpentachlorotrisilane, 1,1,2-tri(1-methylpropyl)pentachlorotrisilane, 1,1,2-tricyclohexylpentachlorotrisilane, 1,1,2-tri-α-phenethylpentachlorotrisilane, 1,1,2-tris(trimethylsilyl)pentachlorotrisilane, 1,2,3-tri-i-propylpentachlorotrisilane, 1,2,3-tri-t-butylpentachlorotrisilane, 1,2,3-tri(1-methylpropyl)pentachlorotrisilane, 1,2,3-tricyclohexylpentachlorotrisilane, 1,2,3-tri-α-phenethylpentachlorotrisilane, 1,2,3-tris(trimethylsilyl)pentachlorotrisilane or the like, and further exemplarily includes octabromotrisilane, 1-i-propylheptabromotrisilane, 1-t-butylheptabromotrisilane, 1-(1-methylpropyl)heptabromotrisilane, 1-cyclohexylheptabromotrisilane, 1-(1,1,2-trimethylpropyl)heptabromotrisilane, 1-α-phenethylheptabromotrisilane, 1-cumylheptabromotrisilane, 1-(trimethylsilyl)heptabromotrisilane, 2-i-propylheptabromotrisilane, 2-t-butylheptabromotrisilane, 2-(1-methylpropyl)heptabromotrisilane, 2-cyclohexylheptabromotrisilane, 2-(1,1,2-trimethylpropyl)heptabromotrisilane, 2-α-phenethylheptabromotrisilane, 2-cumylheptabromotrisilane, 2-(trimethylsilyl)heptabromotrisilane, 1,1-di-i-propylhexabromotrisilane, 1,1-di-t-butylhexabromotrisilane, 1,1-di(1-methylpropyl)hexabromotrisilane, 1,1-dicyclohexylhexabromotrisilane, 1,1-di-α-phenethylhexabromotrisilane, 1,1-bis(trimethylsilyl)hexabromotrisilane, 1,2-di-i-propylhexabromotrisilane, 1,2-di-t-butylhexabromotrisilane, 1,2-di(1-methylpropyl)hexabromotrisilane, 1,2-dicyclohexylhexabromotrisilane, 1,2-di-α-phenethylhexabromotrisilane, 1,2-bis(trimethylsilyl)hexabromotrisilane, 1,3-di-i-propylhexabromotrisilane, 1,3-di-t-butylhexabromotrisilane, 1,3-di(1-methylpropyl)hexabromotrisilane, 1,3-dicyclohexylhexabromotrisilane, 1,3-di-α-phenethylhexabromotrisilane, 1,3-bis(trimethylsilyl)hexabromotrisilane, 1,1,1-tri-i-propylpentabromotrisilane, 1,1,1-tri-t-butylpentabromotrisilane, 1,1,1-tri(1-methylpropyl)pentabromotrisilane, 1,1,1-tricyclohexylpentabromotrisilane, 1,1,1-tri-α-phenethylpentabromotrisilane, 1,1,1-tris(trimethylsilyl)pentabromotrisilane, 1,1,2-tri-i-propylpentabromotrisilane, 1,1,2-tri-t-butylpentabromotrisilane, 1,1,2-tri(1-methylpropyl)pentabromotrisilane, 1,1,2-tricyclohexylpentabromotrisilane, 1,1,2-tri-α-phenethylpentabromotrisilane, 1,1,2-tris(trimethylsilyl)pentabromotrisilane, 1,2,3-tri-i-propylpentabromotrisilane, 1,2,3-tri-t-butylpentabromotrisilane, 1,2,3-tri(1-methylpropyl)pentabromotrisilane, 1,2,3-tricyclohexylpentabromotrisilane, 1,2,3-tri-α-phenethylpentabromotrisilane, 1,2,3-tris(trimethylsilyl)pentabromotrisilane, octaiodotrisilane, 1-i-propylheptaiodotrisilane, 1-t-butylheptaiodotrisilane, 1-(1-methylpropyl)heptaiodotrisilane, 1-cyclohexylheptaiodotrisilane, 1-(1,1,2-trimethylpropyl)heptaiodotrisilane, 1-α-phenethylheptaiodotrisilane, 1-cumylheptaiodotrisilane, 1-(trimethylsilyl)heptaiodotrisilane, 2-i-propylheptaiodotrisilane, 2-t-butylheptaiodotrisilane, 2-(1-methylpropyl)heptaiodotrisilane, 2-cyclohexylheptaiodotrisilane, 2-(1,1,2-trimethylpropyl)heptaiodotrisilane, 2-α-phenethylheptaiodotrisilane, 2-cumylheptaiodotrisilane, 2-(trimethylsilyl)heptaiodotrisilane, 1,1-di-i-propylhexaiodotrisilane, 1,1-di-t-butylhexaiodotrisilane, 1,1-di(1-methylpropyl)hexaiodotrisilane, 1,1-dicyclohexylhexaiodotrisilane, 1,1-di-α-phenethylhexaiodotrisilane, 1,1-bis(trimethylsilyl)hexaiodotrisilane, 1,2-di-i-propylhexaiodotrisilane, 1,2-di-t-butylhexaiodotrisilane, 1,2-di(1-methylpropyl)hexaiodotrisilane, 1,2-dicyclohexylhexaiodotrisilane, 1,2-di-α-phenethylhexaiodotrisilane, 1,2-bis(trimethylsilyl)hexaiodotrisilane, 1,3-di-i-propylhexaiodotrisilane, 1,3-di-t-butylhexaiodotrisilane, 1,3-di(1-methylpropyl)hexaiodotrisilane, 1,3-dicyclohexylhexaiodotrisilane, 1,3-di-α-phenethylhexaiodotrisilane, 1,3-bis(trimethylsilyl)hexaiodotrisilane, 1,1,1-tri-i-propylpentaiodotrisilane, 1,1,1-tri-t-butylpentaiodotrisilane, 1,1,1-tri(1-methylpropyl)pentaiodotrisilane, 1,1,1-tricyclohexylpentaiodotrisilane, 1,1,1-tri-α-phenethylpentaiodotrisilane, 1,1,1-tris(trimethylsilyl)pentaiodotrisilane, 1,1,2-tri-i-propylpentaiodotrisilane, 1,1,2-tri-t-butylpentaiodotrisilane, 1,1,2-tri(1-methylpropyl)pentaiodotrisilane, 1,1,2-tricyclohexylpentaiodotrisilane, 1,1,2-tri-α-phenethylpentaiodotrisilane, 1,1,2-tris(trimethylsilyl)pentaiodotrisilane, 1,2,3-tri-i-propylpentaiodotrisilane, 1,2,3-tri-t-butylpentaiodotrisilane, 1,2,3-tri(1-methylpropyl)pentaiodotrisilane, 1,2,3-tricyclohexylpentaiodotrisilane, 1,2,3-tri-α-phenethylpentaiodotrisilane, 1,2,3-tris(trimethylsilyl)pentaiodotrisilane and the like.

The reaction according to the Kipping method is usually carried out in an inert solvent as is called "Wurtz condensation reaction". Such an inert solvent has been already identified on the subject of the dehydrogenative condensation reaction. The amount of the inert solvent to be used is usually in the range of 1–100, preferably 5–50 parts by volume per one part by volume of the halogenosilane compound.

The alkali metal to be used in the Kipping method may be selected from the group of lithium, potassium, and sodium, and the alkaline earth metal may be magnesium or calcium. These metals, which may be used singly or in combination, are used in an amount of usually 1–100, preferably 1–50 mols per mol of the halogenosilane compound.

In the process of the condensation reaction the metal is dispersed in the reaction solvent, followed by addition in droplets of the halogenosilane compound, or alternatively the metal dispersed in the solvent may be introduced in droplets into the halogenosilane compound dispersed in the solvent. The reaction is preferably effected in an argon, nitrogen or like inert gas atmosphere and with supersonic irradiation. The reaction is usually effected at a temperature of 0°–250° C., preferably 25°–210° C., at a pressure of usually from atmospheric to 200 kg/cm², preferably from atmospheric to 100 kg/cm² and usually for a duration of from 5 minutes to 24 hours, preferably from 30 minutes to 24 hours although dependent upon the particular reaction temperature and the type of metal chosen.

There may be added a crown ether such as 12-crown-4, 15-crown-5, 18-crown-6, dibenzo-12-crown-4, dibenzo-15-crown-5 and dibenzo-18-crown-6 and a diamine such as tetramethylethylene diamine, and these additives usually may be used in an amount of 0.01–100, preferably 0.01–50 mols per mol of the halogeno-silane.

Upon completion of the reaction there is added alcohol such as methanol into the reaction system to render unreacted metal inert and the reaction solution is washed with water to remove NaCl and other side products and thereafter introduced in droplets into methanol, ethanol, IPA, ethyl acetate, pentane, hexane or like alcohol thereby settling and refining the resulting condensate. The reaction solution may be otherwise refined by passage through a Frolisil column. The two refining procedures may be used in combination.

The silicon polymer is preferably soluble in a solvent such as that of a hydrocarbon including benzene, toluene and xylene, that of an ether including tetrahydrofuran and dibutyl ether, and that of an ester such as ethylacetate and butylacetate.

As previously stated, the invention is characterized by the use of a product derived from decomposition of a silicon polymer having organic substituents for a semiconductive layer in a photovolaic element such as a solar cell. The term decomposition as used herein designates at least one of the following modes of reaction:

(1) Dissociation of all or part of the organic substituents (side chain) in the silicon polymer.

(2) Incorporation of all or part of the organic substituents in between the Si—Si bonds in the polymer skeleton to form a main chain.

(3) Decoupling and recoupling of the Si—Si bonds in the polymer skeleton to effect recombination of the main chain skeleton.

(4) Decoupling and recoupling between the Si atom and the side-chain organic substituent in the polymer skeleton, leading to changes in the polymer structure.

(5) Decoupling of the Si—Si bonds in the polymer skeleton, resulting in dissociation of atom groups including the Si atom.

(6) Formation of new Si—Si bonds simultaneously with or subsequent to the reactions (1)–(5) above.

(7) Formation of new Si—Si bonds, resulting in the above reactions (1)–(5).

(8) Molecular or part thereof other than those of silicon polymer coexistent in the decomposing atmosphere are incorporated into decomposed silicon polymer by way of covalent bonding, ion bonding, ligand bonding, physical adsorption or physical entrapment (cage effect).

(9) Molecules or part thereof other than those of silicon polymer coexistent in the decomposing atmosphere induce the above reactions (1)–(7).

(10) Molecules or part thereof other than those of silicon polymer coexistent in the decomposing atmosphere induce the above reactions (1)–(7) and are also incorporated into decomposed silicon polymer by way of covalent bonding, ligand bonding, physical adsorption or physical entrapment.

The silicon polymer, as long as it is capable of any of the foregoing reactions, may be decomposed by the medium of heat, infrared heat, microwave heat, ultraviolet light, glow discharge, ionization gas, or acid such as hydrogen chloride, boron trifluoride, and aluminum trichloride. Two or more of these decomposition alternatives may be used in combination. In the case of infrared heat decomposition, the source of infrared rays may be an infrared lamp, tin oxide semiconductor (e.g. nesa film), ceramics, laser or the like. Infrared irradiation wavelength is in the range of 0.75 µm–200 µm, preferably 0.75 µm–100 µm.

Microwave irradiation may be made in an oven like an electronic range or through a waveguide. Its wavelength is 1 mm–1 m, preferably 1 cm–1 m.

Ultraviolet light sources include a mercury lamp, carbon arc lamp, spark discharge tube, hydrogen or rare gas discharge tube, and electronic synchrotron. Irradiation wavelength is 1 nm–380 nm, preferably 10 nm–380 nm.

Glow discharge may be effected with power from d.c., radio frequency, high frequency, and microwaves.

Ionization gas may be nitrogen, argon and the like, and ionization may be energized by d.c., radio frequency, high frequency, or microwave.

The acid used in the silicon polymer decomposition may be a gas phase present in the decomposing atmosphere, liquid-phase, or in solution.

The silicon polymer may be decomposed per se, or decomposed after it is pulverized, pelletized, fiberized, or cast into film. The silicon polymer if liquid may be directly cast, or otherwise dissolved in a solvent for casting on a substrate. Deposition, CVD, or sputtering technique may be employed, in which case the decomposed silicon polymer is placed on a substrate such as of crystalline silicon, carbon, electrically conductive metal or its oxide, glass, quartz, ceramics, plastics or the like surface-treated with such metal.

The electrically conductive metal referred to above includes gold, platinum., silver, copper, aluminum, titanium, molybdenum, tungsten, chromium, nickel, iron, as well as alloys thereof.

The electrically conductive metal oxide includes zinc oxide, tin oxide, hand indium tin oxide.

The plastics includes polyimide, polyethylene terephthalate, polyethylene naphthalate, polyphenylene sulfide, and polyether ketone.

The aforesaid substrate may optionally, be in the form of a plate, foil, sheet, rod, column, and cylinder, of which plate, foil, and sheet are preferred in view of the use for a photovoltaic element.

The atmosphere in which the silicon polymer is decomposed according to the invention may be an inert gas such as nitrogen and argon, a reducing gas such as hydrogen, or a mixture of these gases, in a vacuum of $10^{-5}$–$10^4$ Pa, preferably $10^{-3}$–$10^3$ Pa. The ratio of the reducing gas in the mixture is usually in the range of 0.01–100 vol.%, preferably 1–50 vol.%. The gaseous atmosphere is maintained at a pressure of $10^0$ Pa–$10^8$ Pa, preferably $10^1$ Pa–$10^7$ Pa. The decomposition temperature is 0°–1,400° C., preferably 20°–1,000° C. and the decomposition reaction time is 0.001 second to 100 hours, preferably 0.01 second to 10 hours.

The silicon polymer decomposition product obtained in accordance with the invention is normally a semiconductive material which can be processed into P-type, I-type, and N-type, but in most cases into I-type.

The photovoltaic element formed from the decomposition product may be N-type or P-type depending upon its treatment with a donor or acceptor compound.

The donor compound includes arsenic hydride or arsenic halogenides such as $AsH_3$, $AsF_3$, $AsCl_3$, $AsBr_3$, and $AsI_3$; organic arsenic compounds such as $CH_3AsBr_2$, $CH_3AsI_2$, $CH_3AsH_2$, $C_2H_5AsBr_2$, $C_2H_5AsCl_2$, $C_2H_5AsH_2$, $(CH_3)_2AsBr$, $(CH_3)_2AsCl$, $(CH_3)_2AsI$, $(CH_3)_2AsH$, $(C_2H_5)_2AsBr$, $(C_2H_5)_2AsCl$, $(C_2H_5)_2AsI$, $(C_2H_5)_2AsH$, $t-C_4H_9AsCl_2$, $C_6H_5AsH_2$, $(C_6H_5)_2AsH$, $(CH_3)_2AsCl_3$, $(CH_3)_3AsCl_2$, $C_6H_5AsCl_4$, $(C_6H_5)_2AsCl_3$, $(C_6H_5)_3AsCl_2$, $(t-C_4H_9)_3As$, $(n-C_4H_9)_3AsI_2$, $(C_6H_5)_2AsCH_3$, $(C_6H_5)_3As$, $(cyclohexyl)_3As$, $(o-tolyl)_3As$, $(p-tolyl)_3As$, and $(C_6H_5)_5As$; antimony halogenides, such as $SbF_3$, $SbF_5$, $SbCl_3$, $SbBr_3$, and $SbI_3$; organic antimony compounds such as $CH_3SbCl_2$, $CH_3SbI_2$, $CH_3SbH_2$, $C_2H_5SbI_2$, $(CH_3)_2SbBr$, $(CH_3)_2SbI$, $(CH_3)_2SbH$, $(CH_3)_3SbBr2$, $(CH_3)_3SbCl_2$, $C_6H_5SbCl_2$, $C_6H_5SbI_2$, $C_6H_5SbH_2$, $(C_2H_5)_3Sb$, $CH_3C_2H_5C_6H_5Sb$, $(t-C_4H_9)_2SbCl$, $(n-C_3H_7)_3Sb$, $(C_2H_5)_5Sb$, $(C_6H_5)_2SbCl$, $(C_6H_5)_2SbH$, $(cyclohexyl)_2SbH$, $(n-C_4H_9)_3Sb$, $(t-C_4H_9)_3Sb$, $(C_6H_5)_2CH_3Sb$, $(cyclopentadienyl)_3Sb$, $(C_6H_5)_3SbBr_2$, $(C_6H_5)_3SbCl_2$, $(C_6H_5)_3Sb$, $(cyclohexyl)_3SbCl_2$, $(cyclohexyl)_3Sb$, $(C_6H_5CH_2)_3Sb$, $(C_6H_5)_4SbBr$, and $(C_6H_5)_5Sb$; phosphoras hydride or phosphorus halogenides such as $PH_3$, $PCl_3$, $PBr_3$, $PI_3$, $P_2I_4$, $PF_5$, $PCl_5$, $PBr_5$, $POCl_3$, $POBR_3$ and $POI_3$; and organic phosphorus compounds such as $CH_3PCl_2$, $C_2H_5PCl_2$, $t-C_4H_9PCl_2$, $C_6H_5PCl_2$, $C_6H_5CH_2PCl_2$, $(CH_3)_2PCl$, $(C_2H_5)_2PCl$, $(C_6H_5)_2PCl$, $CH_3PBr_2$, $C_2H_5PBr_2$, $C_6H_5PBr_2$, $C_6H_5CH_2PBr_2$, $(CH_3)_2PBr$, $(C_2H_5)_2PBr$, $t-C_4H_9PBr_2$, $(C_6H_5)_2PBr$, $CH_3PI_2$, $C_2H_5PI_2$, $t-C_4H_9PI_2$, $C_6H_5PI_2$, $C_6H_5CH_2PI_2$, $(CH_3)_2PI$, $(C_2H_5)_2PI$, $(C_6H_5)_2PI$, $CH_3PH_2$, $C_2H_5PH_2$, $t-C_4H_9PH_2$, $C_6H_5PH_2$, $C_6H_5CH_2PH_2$, $(CH_3)_2PH$, $(C_2H_5)_2PH$, $(C_6H_5)_2PH$, $(CH_3)_3P$, $(n-C_4H_9)_3P$, $(C_6H_5)_3P$, $(C_2H_5)(C_6H_5CH_2)(C_6H_5)P$, $(C_2H_5)(C_6CH_5CH_2)(C_4H_9)P$, $(C_2H_5)(C_6H_5)PO$, and $(C_6H_5)POCl_2$.

The acceptor compound includes boron hydride or boron halogenides such as $BH_3$, $B_2H_6$, $BF_3$, $BCl_3$, $BBr_3$, and $BI_3$; organic boron compounds such as $CH_3BBr_2$, $CH_3BCl_2$, $CH_3BF_2$, $CH_3BI_2$, $CH_3BH_2$, $C_2H_5BBr_2$, $C_2H_5BCl_2$, $C_2H_5BF_2$, $C_2H_5BI_2$, $(CH_3)_2BBr$, $(CH_3)_2BCl$, $(CH_3)_2BF$, $(CH_3)_2BI$, $(CH_3)_2BH$, $C_2H_5BH_2$, $(CH_3)_3B$, $n-C_4H_9BCl_2$, $n-C_4H_9BF_2$, $(C_2H_5)_2BBr$, $(C_2H_5)_2BCl$, $(C_2H_5)_2BH$, $(CH_3)_2C_2H_5B$, $(cyclopentyl)BH_2$, $(1,2\text{-dimetylpropyl})BH_2$, $C_6H_5BBr_2$, $C_6H_5BCl_2$, $C_6H_5BF_2$, $C_6H_5BI_2$, $C_6H_5BH_2$, $(cyclohexyl)BH_2$, $(n-hexyl)BBr_2$, $(n-hexyl)BF_2$, $(n-C_3H_7)_2BCl$, $(1,1,2\text{-trimetylpropyl})BH_2$, $(C_2H_5)_3B$, $(N(CH_3)_2)_3B$, $(2\text{-norbornyl})BH_2$, 9-BBN, $(i-C_3H_7)_3B$, $(n-C_3H_7)_3B$, $(cyclopentyl)_2BBr$, $(cyclopentyl)_2BCl$, $(C_6H_5)_2BBr$, $(C_6H_5)_2BCl$, $(cyclohexyl)_2BCl$, $(cyclohexyl)_2BH$, $(1,1,2\text{-trimetylpropyl})_2BH$, $(t-C_4H_9)_3B$, $(n-C_4H_9)_3B$, $(sec-C_4H_9)_3B$, $(cyclopentyl)_3B$, $(1,2\text{-dimetylpropyl})_3B$, and $(cyclohexyl)_3B$, and their complex compounds of ethers, amines, alcohols, and phenols; aluminum halogenides such as $AlCl_3$ and $AlBr_3$; organic aluminum compounds such as $t-C_4H_9AlCl_2$, $i-C_4H_9AlCl_2$, $(C_2H_5)_2AlF$, $(C_2H_5)_2AlCl$, $C_2H_5AlCl_2$, $C_6H_5AlBr_2$, $C_6H_5AlCl_2$, $C_6H_5AlI_2$, $C_6H_5AlH_2$, $(i-C_3H_7)_2AlCl$, $(n-C_3H_7)_2AlCl$, $(n-C_3H_7)_2AlH$, $(n-C_4H_9)_2AlCl$, $(t-C_4H_9)_2AlCl$, $(C_6H_5)_2AlBr$, $(C_6H_5)_2AlH$, $(cyclohexyl)_2AlH$, $(n-C_4H_9)_2AlH$, $(CH_3)_3Al$, $(C_2H_5)_3Al$, $(i-C_3H_7)_3Al$, $(n-C_3H_7)_3Al$, $(C_6H_5C_2H_5)_2Al$, $(n-C_4H_9)_3Al$, $(t-C_4H_9)_3Al$, and $(i-C_4H_9)_3Al$; gallium halogenides such as $GaCl_3$, $GaBr_3$ and $GaI_3$; organic gallium compounds such as $CH_3GaH_2$, $C_2H_5GaCl_2$, $(CH_3)_2GaCl$, $n-C_3H_7GaCl_2$, $(CH_3)_3Ga$, $(C_2H_5)_2GaCl$, $(C_2H_5)_2GaH$, $(cyclohexyl)GaCl_2$, $(C_2H_5)_3Ga$,$(n\text{-heptyl})GaCl_2$, $(i-C_3H_7)_3Ga$, $(n-C_3H_7)_3Ga$, $(n-C_4H_9)_3Ga$, $(t-C_4H_9)_3Ga$, $(sec-C_4H_9)_3Ga$, $(i-C_4H_9)_3Ga$, and $(C_6H_5)_3Ga$; indium halogenides such as $InCl_3$ and $InBr_3$; and organic indium compounds such as $(CH_3)_2InBr$, $(CH_3)_3In$, $(C_2H_5)_3InCl$, $(C_3H_5)_3InF$, $(C_3H_5)_3In$, $(n-C_3H_7)_3In$, $(n-C_4H_9)_3In$, $(i-C_4H_9)_3In$, and $(C_6H_5)_3In$.

These acceptor compounds may be used in combination.

The above donor and acceptor compounds may be added to or admixed with the starting monomer, or may be admixed with the silicon polymer prior to decomposition, or may be present in a gas, liquid, or solid phase during or after decomposition of the silicon polymer. These alternative treatment procedures may be combined at will.

The ratio of the donor- or acceptor-forming compound to the starting monomer is in the range of from $1\times10^{-10}$ to 100 mols, preferably from $1\times10^{-10}$ to 1 mol per mol of monomer. The monomer and the donor or acceptor compound may be admixed prior to charging into a reactor, or may be separately charged and mixed in the reactor.

The ratio of the donor or acceptor compound to the starting silicon polymer prior to decomposition is in the range of from $1\times10^{-10}$ to 1,000 grams, preferably from $1\times10^{-10}$ to 100 grams per gram polymer. The polymer and the donor or acceptor compound may be mixed together per se, or after either or both are dissolved in a solvent.

When the donor or acceptor compound is present in a gaseous phase during decomposition of the silicon polymer, its concentration in the decomposing atmosphere is in the range of from 0.1 vol. ppb to 100 vol. %, preferably from 1 vol. ppb to 100 vol. %. The donor or acceptor compound may be coated over the surfaces of the polymer in its liquid state, or after being dissolved in a solvent to a concentration of above 0.1 vol. ppb. Alternatively, the polymer may be immersed in liquid donor or acceptor compound or its solution of higher than 0.1 vol. ppb concentration. Further alternatively, the polymer may be dusted with solid particles of the donor or acceptor compound.

The above treatment alternatives may be similarly applied to the silicon polymer after having been decomposed. The treatment temperature is from $-200°$ C. to $2,000°$ C., preferably from $0°$ to $1,400°$ C., and the treatment length is from 1 second to 100 hours, preferably from 1 second to 10 hours.

The thus decomposed silicon polymer is a yellowish, dark brown or glossy silver mirror-like material. In its film form, the polymer is usually $0.01\mu m$–$500$ $\mu m$, preferably $0.1$ $\mu m$–$50$ $\mu m$ thick and usually has an optical band-gap (Eo) of 0.1–4.0 eV, preferably 0.5–2.5 eV.

The decomposed silicon polymer according to the invention may be suitably applied to a semiconductor element having a PN-, PIN-, or Schottky-junction. PN-junction elements may be formed on respective P- and N-type pieces of the polymer, or such pieces may be laminated together. Needless to mention, a PIN-junction semiconductor element may be similarly prepared. Schottky-junctions may be formed with use of a metal such as aluminum, chromium, platinum, copper, or gold which the silicon polymer is deposited upon or laminated with in a well known manner. An insulating layer may be interposed between the metal and the polymer layer.

When applying one silicon polymer layer upon another, formation of the various junctions in a semiconductor element would be practically made under the same conditions as in the decomposition of the silicon polymer and the treatment thereof with the donor or acceptor compound during which the respective junctions can be formed.

When laminating strips or pieces of the decomposed silicon polymer, this may be done at a temperature of from $-200°$ C. to $2,000°$ C., preferably $0°$ to $1,400°$ C. in an atmosphere of the aforementioned inert or reducing gases in a vacuum of $10^{-5}$–$10^{4}$ Pa, preferably $10^{-3}$–$10^{3}$ Pa and at a pressure of $10^{0}$ Pa–$10^{8}$ Pa, preferably $10^{1}$ Pa–$10^{7}$ Pa and for a duration of from 1 second to 100 hours, preferably from 1 second to 10 hours.

The thickness of each of the P-, I-, and N-type layers is in the range of from 0.01 $\mu m$ to 500 $\mu m$, preferably from 0.1 $\mu m$ to 50 $\mu m$.

The inventive photovoltaic element basically comprises a surface electrode, a semiconductor layer and an opposite (back surface) electrode. The surface electrode may be formed of an electrically conductive metal oxide such as zinc oxide, tin oxide and indium tin oxide, an electrically conductive metal such as gold, platinum, silver, copper, aluminum, titanium, molybdenum, tungsten, chromium, nickel, iron, and alloys thereof. The electrically conductive metal should be thin enough to permit sufficient light permeation and is usually of the order of 50–500 angstroms. The back surface electrode may be formed from metals similar to those used for the surface electrode and additionally from carbon and crystalline silicon.

The above two electrodes may be formed by any known processes such as sol/gel, metal spray, paste, deposition, sputtering, and the like.

There is no particular form or mode in which the inventive photovoltaic element is used, given its typical application as a semiconductor layer. There may be used any suitable light permeable substrate for reinforcement of the front surface layer, or any suitable opaque substrate to support the back surface layer of the element. A plurality of elements may of course be used in combination.

The invention will be further described by way of the following examples.

EXAMPLE I (1) Synthesis of Silicon Polymer

A 1,000 ml autoclave was charged with 11.96 grams (0.117 mol) of 1,2-dimethylpropylsilane, 2 kg/cm$^2$ (0.071 mol) of silane gas, 0.347 grams (1.19 mmol) of bis-cyclopentadienyl zirconium dichloride, 1.124 grams (2.37 mmols) of tris-trimethylsilylsyl lithium/tetrahydrofuran complex and 15 ml of dry toluene. The admixture was stirred at 200° C. for 5 hours, followed by dilution with toluene and then filtered under pressure by a Millipore filter (0.2 μm). The filtrate was vacuum-dried thereby providing a dark brown solid product (4.40 grams). This solid product was dissolved in toluene (15 ml), followed by addition of trifluoroacetate (5 ml), and was stirred at 80° C. for 1 hour. The resulting reaction solution was introduced by droplets into methanol (200 ml) to precipitate the solid. The precipitate was filter by a Millipore filter (0.2 μm) and dried in vacuum at room temperature. There was obtained a light yellow particulate silicon polymer (2.75 grams).

The resultant particulate polymer was determined by GPC analysis to show a molecular weight (Mw) of 6,300 (by conversion to polystyrene). ESCA analysis indicated the carbon/silicon element ratio to be 65:35, from which the ratio of 1,2-dimethylpropylsilane unit/silane gas unit was calculated to be 37:63. 1HNMR analysis showed the integrated ratio of 1,2-dimethylpropyl proton/Si-H proton to be 11:1.7, indicating that the resultant silicon polymer had an organic substituent and its structure was predominantly of formula II above.

(2) Manufacture of Photovoltaic Element

The resultant silicon polymer was dissolved in xylene to produce 10 mass % xylene solution and spin-coated over a molybdenum film (100 nm) coated quartz glass sheet (5 cm square) at a rate of 1,600 rpm for 5 seconds. The thus coated sheet was subjected to thermal decomposition in a hydrogen stream (2,000 ml/min) at 600° C. for 3 hours, thereby providing a brown transparent silicon polymer film (0.202 μm). The film was coated with vacuum-deposited (90 angstroms) gold. After a 1 cm square substrate was prepared, lead wires was applied by gold paste to the molybdenum film layer 13 and the gold film layer 11, respectively.

The thus formed photovoltaic element was measured by a solar simulator (AM 1.5, 100 mW/cm$^2$) irradiating a pseudo-sun beam to the gold film side, thereby indicating an open-circuit voltage (Voc) of 2.8 mV and a short-circuit current (Isc) of 0.4 μA.

EXAMPLE II (1) Synthesis of Silicon Polymer

A 1,000 ml three-necked flask was charged with 9.98 grams (434 mmols) of metallic sodium, 2.2 grams (12.5 mmols) of 12-crown-6 ether, and 250 ml of dry toluene. The admixture was vigorously stirred in nitrogen atmosphere at a reflux temperature, followed by addition in droplets of 26.6 grams (118 mmols) of benzyltrichlorosilane over 30 minutes. Reflux stirring was continued for 3 hours. The admixture was cooled to room temperature and thereafter added with droplets of methanol (400 ml) over 10 minutes. The reaction mixture was taken into a separatory funnel, added with diethyl ether (600 ml) and washed with water (200 ml×4 times). The diethyl ether layer was dried with magnesium sulfide and condensed in vacuum, thereby providing a yellow viscous liquid (10.7 grams). This liquid was dissolved in toluene (30 ml) and introduced by droplets into methanol (300 ml). The resulting precipitate was filter and vacuum-dried to produce a light yellow particulate silicon polymer (2.30 grams). GPC analysis revealed a molecular weight (Mw) of 1,300 (by polystyrene conversion).

(2) Manufacture of Photovoltaic Element

The resultant silicon polymer was dissolved in xylene to produce a 10 mass % xylene solution and spin-coated over an indium tin oxide coated quartz glass sheet (5 cm square) at a rate of 1,600 rpm for 4 seconds. The thus coated sheet was subjected to thermal decomposition in an argon stream (2,000 ml/min) at 400° C. for 3 hours, thereby providing a reddish brown transparent silicon polymer film (0.130 μm). The film was vacuum-deposited (1,000 angstroms) with gold. After a 1 cm square substrate was prepared, lead wires were applied by gold paste to the tin oxide film layer 13 and the gold film layer 11, respectively.

The thus formed photovoltaic element was measured by a solar simulator (AM 1.5, 100 mW/cm$^2$) irradiating a pseudo-sun beam to the glass substrate side 14, thereby indicating an open-circuit voltage (Voc) of 9.0 mV and a short-circuit current (Isc) of 0.03 μA.

What is claimed is:

1. A photovoltaic element which comprises a semiconducting material resulting from decomposition of a silicon polymer having an organic substituent.

2. A photovoltaic element according to claim 1 wherein said organic substituent is selected from the group consisting of a hydrocarbon group, a halogenated hydrocarbon group, and a silyl group $R^3R^4R^5Si-$, wherein $R^3$–$R^5$ each are identical or different, including $C_1$–$C_8$ alkyl groups and $C_6$–$C_{10}$ aryl groups.

3. A photovoltaic element according to claim 1 wherein said silicon polymer has at least one of the repeating units of the formula

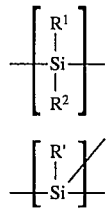

(I)

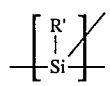

(II)

and

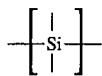

(III)

in the above formulae (I) and (II) above, $R^1$, $R^2$ and $R'$ each are hydrogen, $C_1$–$C_{12}$ hydrocarbon group, halogenated hydrocarbon group, or silyl group $R^3R^4R^5Si-$ and may be crosslinked within and between each repeating unit.

4. A photovoltaic element according to claim 3 wherein said repeating unit or units contained in said polymer essentially has (have) an organic substituent from the group consisting of a hydrocarbon group, a halogenated hydrocarbon groupsand a silyl group $R^3R^4R^5Si-$, wherein $R^3$–$R^5$ each are identical or different, including $C_1$–$C_8$ alkyl groups and $C_6$–$C_{10}$ aryl groups.

5. A process for the production of a semiconductor material for a photovoltaic element resulting from decomposition of a silicon polymer having organic substituents, said decomposition involving at least one of the following modes of reaction:

(1) dissociation of all or part of the organic side chain substituents in the silicon polymer;

(2) incorporation of all or part of the organic substituents in between the Si—Si bonds in the polymer skeleton to form a main chain;

(3) decoupling and recoupling of the Si—Si bonds in the polymer skeleton to effect recombination of the main chain skeleton;

(4) decoupling and recoupling between the Si atom and the side-chain organic substituent in the polymer skeleton, leading to changes in the polymer structure;

(5) decoupling of the Si—Si bonds in the polymer skeleton, resulting in dissociation of atom groups including the Si atom;

(6) formation of new Si—Si bonds simultaneous with or subsequent to the reactions (1)–(5) above;

(7) formation of new Si—Si bonds, resulting in the above reactions (1)–(5);

(8) molecular or part thereof other than those of silicon polymer coexistent in the decomposing atmosphere are incorporated into decomposed silicon polymer by way of covalent bonding, ion bonding, ligand bonding, physical adsorption or physical entrapment;

(9) molecules or part thereof other than those of silicon polymer coexistent in the decomposing atmosphere induce the above reactions (1)–(7); and

(10) molecules or part thereof other than those of silicon polymer coexistent in the decomposing atmosphere induce the above reactions (1)–(7) and are also incorporated into decomposed silicon polymer by way of covalent bonding, ligand bonding, physical adsorption or physical entrapment.

* * * * *